United States Patent [19]

Owen

[11] Patent Number: 5,448,202
[45] Date of Patent: * Sep. 5, 1995

[54] SIGMA-DELTA FM DEMODULATOR

[75] Inventor: Jeffrey R. Owen, Portland, Oreg.

[73] Assignee: Seiko Communications Holding N.V., Netherlands Antilles

[ * ] Notice: The portion of the term of this patent subsequent to Sep. 6, 2011 has been disclaimed.

[21] Appl. No.: 271,049

[22] Filed: Jul. 6, 1994

Related U.S. Application Data

[63] Continuation-in-part of Ser. No. 92,381, Jul. 14, 1993, Pat. No. 5,345,188.

[51] Int. Cl.⁶ .............................................. H03D 3/18
[52] U.S. Cl. .................................. 329/323; 329/336; 329/341; 329/343; 455/214; 455/337; 331/49; 331/57
[58] Field of Search ................ 329/323, 327, 336, 341, 329/343; 455/214, 337; 331/49, 57

[56] References Cited

U.S. PATENT DOCUMENTS

| | | | |
|---|---|---|---|
| 4,368,434 | 1/1983 | Miller et al. | 329/336 |
| 4,707,666 | 11/1987 | Pfeifer et al. | 455/214 X |
| 5,077,538 | 12/1991 | Gehrt et al. | 455/214 X |

OTHER PUBLICATIONS

Two articles entitled "A Use of Limit Cycle Oscillations to Obtain Robust Analog-to-Digital Converts" and Table-Based Simulation of Delta-Sigma Modulators. Both articles are located in a manual entitled Oversampling Delta-Sigma Data Converters published by The Institute of Electrical and Electronics Engineers, Inc. in 1992.

Primary Examiner—Siegfried H. Grimm
Attorney, Agent, or Firm—Elmer Galbi

[57] ABSTRACT

Digital frequency demodulation is accomplished by monitoring similar transitions in an FM radio signal to determine frequency. Time intervals between similar transitions in the FM signal are established by selecting anticipated transition times and accumulating error values relative to actual transition times. Accumulated error values provide a basis for further selecting anticipated transition times in such manner that a reported sequence of anticipated transition times provides a basis for inferring signal frequency. In one illustrated embodiment, the chosen transition times are positive transitions in the FM signal and the anticipated times of transition are taken from a set of two time periods, an early transition and a late transition relative to a valid transition window. In one embodiment of the invention, accumulated error is stored in an integrator device while in another embodiment accumulated error is stored in the phase of a bi-frequency oscillator. By reporting the selected anticipation times by associated values in a digital bit stream, frequency may be inferred by computing a ratio of given digital values in the bit stream relative to the total number of samples in the bit stream.

12 Claims, 11 Drawing Sheets

SIGMA-DELTA FM DEMODULATOR

RELATED APPLICATION

The present application is a continuation-in-part of U.S. patent application Ser. No. 08/092,381, filed Jul. 14, 1993, now U.S. Pat. No. 5,345,188, and entitled SIGMA-DELTA DIGITAL FM DEMODULATOR.

BACKGROUND OF THE INVENTION

Frequency modulated (FM) radio signals are well known and have been widely used for audio broadcasts, and more recently used for data broadcasts. For example, common RCC POCSAG and a paging system employing FM radio broadcast subcarriers and small power efficient receiving paging devices, e.g., wristwatch paging devices, have been successfully implemented. Use of such devices to capture and demodulate the FM radio signal has required considerable analog circuitry.

Conventional analog circuits used for FM demodulation include phase or frequency locked loops and many varieties of discriminator circuits. FM demodulation has also been conducted by use of hybrid digital-analog circuits such as pulse count demodulators and application of a digitized intermediate frequency (IF) signal to a digital FM demodulator. Generally, analog based FM demodulation suffers from large physical size requirements and digital based FM demodulation requires very high speed analog-to-digital conversion or extremely high clock speeds.

Analog demodulation of FM radio signals carries with it many of the difficulties inherent in analog circuitry. Implementation in integrated circuitry requires extensive external, i.e., off-chip, components or use of massive integrated circuit resources to implement analog devices. Also, analog circuits implemented on large multi-function integrated circuits are especially susceptible to noise or interference from other circuitry on the integrated circuit chip. Most analog demodulators require resonators provided as large off-chip components. Finally, most FM demodulation implementations, due to relatively large size, are difficult to miniaturize especially in a small paging device such as a wristwatch paging device.

FM demodulation can be divided generally into five categories: discriminator circuits with linear filters followed by envelope detectors, frequency and phase lock loops, pulse count demodulators, high speed counter demodulators, and conversion of analog IF signals to digital signals followed by digital FM demodulation. Discriminator circuits are physically large and sometimes require specific tuning. Also, if the demodulated signal is to be digitally processed, then an analog-to-digital conversion block is required. Frequency and phase lock loops require relatively large off-chip components, e.g., capacitors, and are not generally easy to implement in integrated circuitry. If the demodulated signal is to be digitally processed, then an analog-to-digital conversion block is required. Also, VCO linearity typically affects demodulation distortion. Pulse count demodulators typically employ a triggered one-shot circuit and require large off-chip components, e.g., capacitors. Such pulse count demodulators are generally applicable only to very wide band FM signals. A high speed counter-based demodulator can measure a time differential between given transitions in the FM signal, however, such timing measurement requires an extremely fast counter, i.e., driven by a very high speed clock, and requires relatively large power input and heat dissipation. Conversion of analog IF signals to digital signals followed by digital FM demodulation generally requires very high speed analog-to-digital conversion and relatively high speed digital signal processing to accomplish digital demodulation.

As may be appreciated, minimizing use of analog circuitry in an FM demodulator reduces the above-noted problems inherent in analog circuitry. Also, if an FM signal is to be ultimately applied to a digital application, such as in a paging device, it is desirable to accomplish analog-to-digital conversion at the time of demodulation, however, no such FM demodulators are presently available. Reducing such problems is generally desirable for any FM demodulator, but can be especially important in the context of small radio signal receiving devices such as wristwatch based paging devices where size and performance, i.e., data integrity and power consumption, are critical requirements. To the extent that the FM demodulator can be implemented digitally and in digital integrated circuitry, the product is improved with respect to noise immunity, overall packaging, and design versatility.

SUMMARY OF THE INVENTION

In accordance with the present invention, digital frequency demodulation is accomplished by monitoring chosen transitions of an FM signal; selecting, based on an accumulated error value, one of a plurality of anticipated times between adjacent chosen signal transitions; measuring the difference between the actual transition time and the selected anticipated time; and incorporating this difference into an accumulated error value. The frequency of the signal is inferred by the series of selected anticipated times generated. If the rate of selection of anticipated times is greater than the bandwidth of the modulating signal, then the incorporation of the individual differences into an accumulated error can be done in such a manner so as to spectrally shape the majority of the quantization noise outside the frequency range of the modulating signal, where it is easily removed by digital filtering.

In one preferred form of the present invention, the chosen transitions of the FM signal chosen for monitoring are all consecutive positive going transitions, i.e., consecutive rising edges in an associated intermediate frequency (IF) signal. The time differential between such chosen transitions provides a basis for inferring frequency of the FM signal. The anticipated transition times are taken from a set of two possible selections, an early selection and a late selection. The early selection is associated with a digital value "one" and the late selection is associated with a digital value "zero." For each selected anticipated time of transition, the associated digital value is reported, i.e., for each early selection a digital "one" is reported and for each late selection a digital "zero" is reported. The early selection is slightly less than the earliest next valid chosen transition and the late selection is slightly greater than the latest next valid chosen transition in the FM signal. Thus, choosing the early anticipated transition time always produces a negative error, and choosing the late transition time always produces a positive error. The accumulated error is the summation of all past errors, i.e., past differences between the actual times of the chosen transition and the selected anticipated times. Choosing the early anticipated time whenever the accumulated error is greater than zero and choosing the late anticipated time otherwise establishes negative feedback and assures an accumulated error value within given limits. The frequency of the signal is inferred from the ratio of reported "ones" to the total number of reported "ones" and "zeros."

In an alternative embodiment, a phase continuous bi-frequency oscillator selectively operates at one of two frequencies on a cycle-by-cycle basis. The higher frequency is associated with a digital value "one", and is slightly higher in frequency than the maximum frequency to be demodulated. The lower frequency is associated with a digital value "zero", and is slightly lower in frequency than the minimum frequency to be demodulated. At each transition of the oscillator, a binary decision is made as to the relative timing between the transition of the FM signal and the transition of the oscillator output, i.e., whether the FM signal transition occurred either earlier or later than the transition of the oscillator. The result of the decision is then used to select the oscillator frequency for the next cycle whereby the next oscillator transition always moves toward the next FM signal transition. The frequency of the signal is inferred from the relative number of "ones" and "zeroes." The accumulated error resides in the phase of the oscillator when the transition of the FM signal occurred, e.g., the position of the transition within a delay. Accordingly, this embodiment of the present invention need not employ analog IC device technology to represent an accumulated error, but rather may use totally digital IC device technology, e.g., a "ring oscillator" based on a sequence of gate delays.

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE PREFERRED EMBODIMENT

Figure 1:
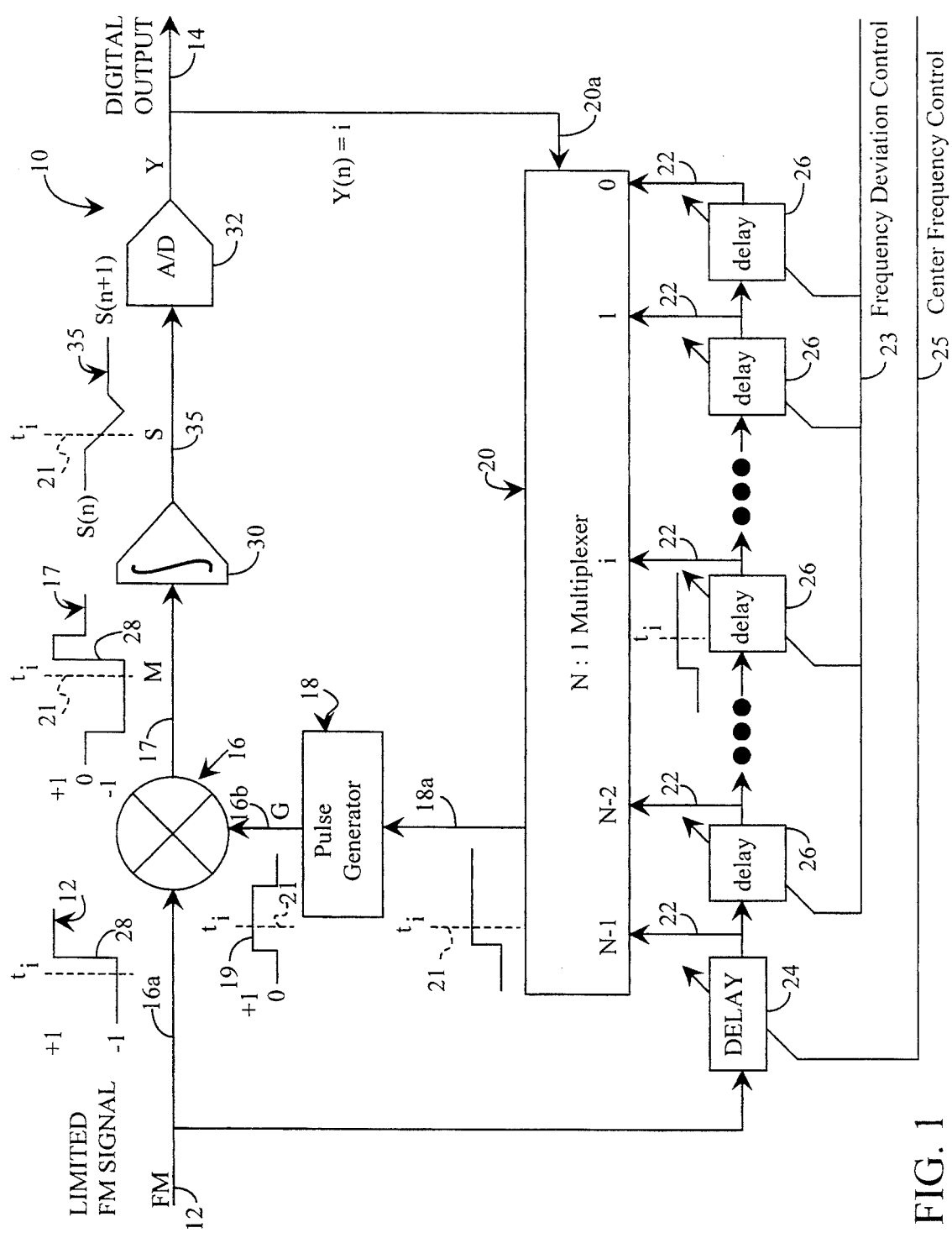
FIG. 1 is a block diagram of a sigma-delta digital FM demodulator according to the present invention.

The preferred embodiment of the invention as illustrated in the drawings comprises generally a device receiving a frequency modulated signal and providing measurement of frequency in that signal for information recovery therefrom. Frequency information is recovered generally by measuring a time differential between similar adjacent transitions in the FM signal. The relatively low-power device advantageously delivers digital frequency data, thereby avoiding need for a separate analog-to-digital conversion block in applications where data is to be later digitally processed. Because the device is primarily digital in nature, many of the disadvantages associated with prior analog FM demodulation are avoided. Furthermore, the device in its preferred form is particularly well suited for implementation in miniaturized power-efficient devices, such as small paging devices operating according to FM radio signal data broadcast.

Figure 2:
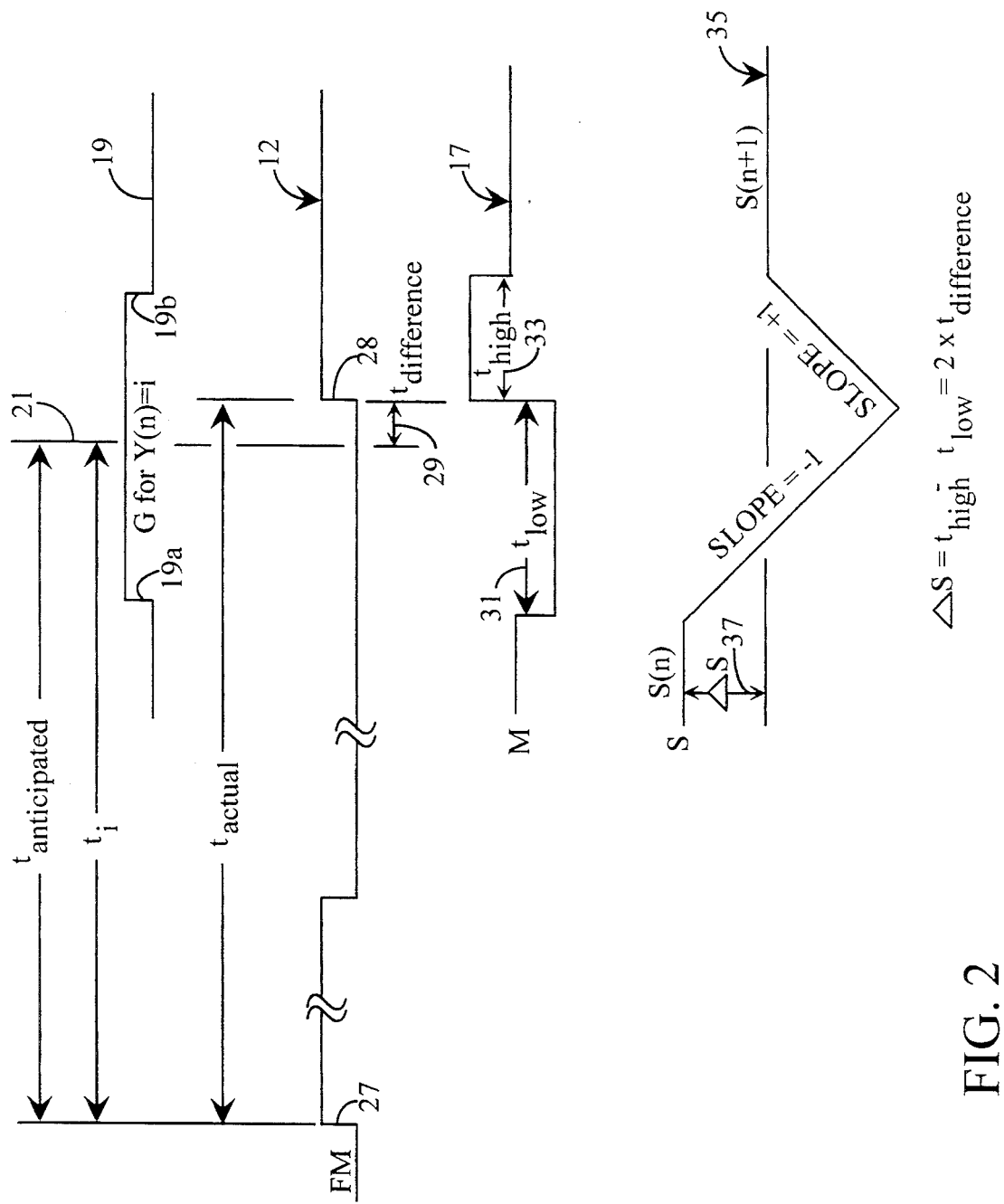
FIG. 2 is a timing diagram illustrating operation of the sigma-delta digital FM demodulator of FIG. 1.

FIG. 1 illustrates in block form the general arrangement of a sigma-delta digital FM demodulator according to the present invention. FIG. 2 is a timing diagram illustrating an FM signal processed by the demodulator of FIG. 1 and various signals developed by the demodulator of FIG. 1 during demodulation in accordance with the present invention.

In FIGS. 1 and 2, sigma-delta FM digital demodulator 10 receives a limited FM signal 12 and provides a digital output 14. FM signal 12 is a limited FM signal, i.e., a square wave, having amplitude variation between, for example, negative one and positive one volt. Transitions in the FM signal 12 represent frequency of the FM signal 12. For example, FM signal 12 can be derived from an FM radio signal broadcast and converted to an intermediate frequency (IF) signal for demodulation as is typically done in conventional FM radio signal processing. As explained more fully hereafter, digital output 14 represents the frequency of FM signal 12, the frequency information being later recovered by further analysis of digital output 14.

Demodulator 10 includes a digital multiplier 16 receiving at a first input 16a the limited FM signal 12 and at a second input 16b a gate signal 19, also designated G herein, from a pulse generator 18. Pulse generator 18 produces its gate signal 19 as a single pulse going from zero volt to positive one volt for a given pulse duration. Pulse generator 18 provides the gate signal 19 in selected delayed response to a first actual transition 27 (FIG. 2) in the limited FM signal 12. The center of the pulse in gate signal 19 represents an anticipated next transition 21, also indicated as the time ti, in the FM signal 12 for a next actual transition 28. The time differential 29 between the time of the anticipated next transition 21 and the actual next transition 28 represents an error with respect to the selected anticipated next transition 21.

Pulse generator 18 is triggered at its trigger input 18a by the output of a multiplexer 20. For an N:1 multiplexer, N trigger signals 22 are applied to the inputs of multiplexer 20. Each of the trigger signals 22 is offset in time by a given magnitude small delay $t_{delay}$ from the previous trigger signal 22. The FM signal 12 is applied to a first adjustable delay block 24 providing a large delay $t_{DELAY}$ and then applied in series to a sequence of 5 smaller adjustable delay blocks 26 each providing a small delay $t_{delay}$. Adjustment in large delay $t_{DELAY}$ as provided by delay block 24 is provided by a center frequency control signal 25. Adjustment in the small delay $t_{delay}$ is provided by a frequency deviation control signal 23 applied in common to each of the delay blocks 26.

For a bandwidth limited FM signal, adjacent similar transitions, e.g., rising edges, in the FM signal 12 occur within a given window of valid next transitions. The delay $t_{DELAY}$ of block 24 is of magnitude corresponding to the time differential between a given transition in the FM signal 12, e.g., actual transition 27 (FIG. 2), and the beginning of this window of next valid transition, e.g., the window in which next actual transition 28 occurs, less half the duration of the gate signal pulse. The output of delay block 24 is applied to the high order input, i.e., input N−1, of multiplexer 20 as the most early trigger signal 22, and also to the first delay block 26. Each subsequent delay block 26 applies its output as one of the trigger signals 22 to the next input of the multiplexer 20 and also to the downstream next delay block 26.

Thus, a series of trigger signals 22 offset in time by the delay $t_{delay}$ are made available at the inputs of the multiplexer 20. Each trigger signal 22 is a function of a prior transition in the FM signal 12, i.e., actual transition 27, and represents an anticipated time of next actual transition, i.e., transition 28. Thus, N anticipated times of next transition are made available. By selecting one of the trigger signals 22 for application to the pulse generator 18, i.e., by appropriately addressing multiplexer 20 at its address input 20a, the gate signal 19 is applied to the multiplier 16 as a selected anticipated next transition 21. Selection among the trigger signals, i.e., addressing of multiplexer 20, is a function of the digital output 14 in the previous processing cycle.

The multiplier output 17, also designated M, varies between three states, i.e., negative one volt, zero volt, and positive one volt, according to multiplication of the FM signal 12 and the gate signal 19. Outside the pulse provided in the gate signal 19, i.e., before and after the pulse, multiplier output 17 remains at zero volt. During the pulse provided in the gate signal 19, however, the state of multiplier output 17 follows the state of FM signal 12. In particular, at the rising edge 19a of gate signal 19 the multiplier output 17 goes to negative one volt for a time period 31 FIG. 2), also designated $t_{low}$. At the actual next transition 28 in the FM signal 12, however, multiplier output 17 goes to positive one volt for a time period 33 (FIG. 2), also designated $t_{high}$, concluding with the falling edge 19b of the gate signal 19. The time differential 29 corresponds to the difference between time periods 31 and 33, i.e., the half difference between $t_{low}$ and $t_{high}$. If the anticipated next transition 21, i.e., the center of the pulse provided in gate signal 19, is coincident with the actual next transition 28 then the time periods 31 and 33 are equal. Otherwise, the difference between time periods 31 and 33 corresponds to an error in the anticipated next transition 21 relative to the actual next transition 28.

Application of the multiplier output 17 to an integrator 30 generates representation of errors in the anticipated next transition 21 relative to the actual next transition 28, and further accumulates such errors over time. For example, if the time of the anticipated next transition 21 were exactly correct, integrator 30 integrates a negative one volt signal for the same period of time it integrates a positive one volt signal with a net accumulation of no error, i.e., delta S difference 37 equals zero. As the anticipated next transition 21 deviates from the actual next transition 28, however, integrator 30 integrates one of a positive or a negative voltage for a relatively greater time and thereby accounts for the error in the anticipated transition 21, i.e., measures the time differential 29. Integrator 30 continuously integrates the multiplier output 17 throughout operation of the demodulator 10. By selecting each anticipated next transition 21 under negative feedback, the integrator output 35, also designated S, remains within a given range.

In the illustrated example of FIGS. 1 and 2, i.e., where the anticipated transition 21 is slightly ahead of the next transition 28, the integrator output S 35, i.e., the overall accumulated error following the current cycle $S(n+1)$ is more negative than the integrator output following the previous cycle $S(n)$. An early anticipated transition 21 results in a more negative accumulated error, i.e., a more negative integrator output 35. Similarly, a late anticipated transition 21 results in a more positive accumulated error, i.e., a more positive integrator output 35. Thus, as illustrated in FIG. 2, the integrator 30 during the $t_{low}$ time period 31 will integrate a negative voltage and its output 35 will follow a −1 slope. During the $t_{high}$ time period 33, when it receives a positive voltage, integrator output 35 follows a +1 slope. The delta S difference 37 in integrator output 35 from one cycle to the next, i.e., the difference between output $S(n+1)$ and output $S(n)$, corresponds to the error in the most recent anticipated next transition 21 relative to the actual next transition 28. As may be appreciated, if the anticipated next transition 21 is coincident with the actual next transition 28, then integrator 30 will integrate a positive voltage for as long as it integrates a negative voltage with no net change in the integrator output 35, i.e., $S(n+1)$ equals $S(n)$. Otherwise, the change in integrator output represents an error in the anticipated next transition 21, and the current state of integrator output 35 represents overall accumulated errors for all past anticipated next transitions 21.

The integrator output 35, i.e., the overall accumulated error in time of anticipated transitions 21 relative to time of corresponding actual transitions 28, is applied to an analog-to-digital block 32. Analog-to-digital block 32 output, also designated Y, is the digital output 14. By applying the digital output 14 to the address input 20a of multiplexer 20, the accumulated error, i.e., the integrator 30 output 35, is maintained within a given range by negative feedback. As the accumulated error moves in a given direction, the multiplexer 30 appropriately selects one of the trigger signals 22 to move when necessary the accumulated error in the opposite direction. Overall, the accumulated error represented in the integrator output 14 remains within a given range as a result of such negative feedback.

The digital output 14 is further analyzed to derive useful frequency information. Such further analysis can simply be that of averaging groups of values in the stream of digital output 14. The average value through a given time period represents the average frequency of the FM signal 12 during that period. Thus, digital output 14 could be applied to a next processing block (not shown in FIG. 1) averaging groups of values in digital output 14 and providing frequency information representing information carried in the FM signal 12. More particularly, the illustrated digital output 14 can vary between zero and N−1. Each value appearing in the digital output 14 corresponds to a transition location within the window of valid next transitions in the FM signal 12. The average value of a group of values appearing in digital output 14 over a given time interval provides a basis for identifying a location in the window of valid next transitions, and therefore a basis for computing average frequency for the given time interval.

Center frequency control signal 25 and frequency deviation control signal 23 operate dynamically to maintain appropriate adjustment in the delay elements 24 and 26. More particularly, upon start up the frequency deviation control signal 23 is set to maximum delay and the center frequency control signal 25 is set to a mid-point delay. A negative feedback loop is then executed to adjust the center frequency control signal 25 until the digital output 14 averages one half of N−1. Overall, it is assumed that the average occurrence for actual next transitions 28 is the center of the window of valid next transitions in FM signal 12. Based on this assumption, adjusting center frequency control signal 25 until the digital output averages one half of N−1 insures that the group of available anticipated transition times are well centered about the window of valid next transitions in the FM signal 12. This negative feedback control loop for the center frequency control signal 25 remains in operation during use of the sigma-delta digital FM demodulator 10.

After the center frequency control signal is adjusted as described above, the frequency deviation control signal 23 is modified. In particular, frequency deviation control signal 23 is adjusted to fill a good portion of the full scale of values appearing in digital output 14. Thus, frequency deviation control signal 23 is adjusted until the digital output 14 covers a large range of values, e.g., $\frac{7}{8}$ of full scale. In FM broadcast receiver implementations where audio signals vary widely and a stereo pilot signal is present, the frequency deviation control signal 23 may be adjusted until the pilot peak amplitude is approximately 6% of full scale thereby allowing total FM deviation of approximately 150% for a 9% pilot signal.

The above described FM demodulator 10 is set forth in general terms and could be implemented in a large scale digital circuit wherein the digital output 14 is at a given resolution, i.e., number of bits in each value presented, and a given size of multiplexer 20, i.e., selection among a large number of possible trigger signals 22 very closely spaced in time. As may be appreciated, the greater the resolution in digital output 14 and the larger the number of trigger signals 22 the more accurate the FM demodulation. Greater processing overhead, circuit resources and component tolerances are required for such accuracy and resolution. The invention can be implemented, however, on a much smaller scale while still providing meaningful frequency information. For example, small scale A-to-D conversion, e.g., 2-bit flash convertors, may be used in a relatively small scale implementation of the present invention. Thus, while the sigma-delta FM demodulator described herein can be implemented at higher resolution and complexity, such implementations may be of considerable size and may not be justified in light of alternative FM demodulation methods and devices available. For smaller scale implementations, however, the FM demodulator of the present invention can be an effective solution to FM demodulation in a miniaturized FM signal receiver.

The FM demodulator of the present invention is particularly well suited for very small scale implementations, e.g., such as in miniaturized FM radio signal receiving devices serving as wristwatch paging devices responsive to FM radio signal data broadcast. The remaining description and drawings illustrate a small scale implementation of the present invention, however, it will be understood that the present invention is not limited to such small scale implementations. More particularly, the remaining description will focus on a single bit digital output and selection among only two anticipated next transitions 21.

Figure 3:
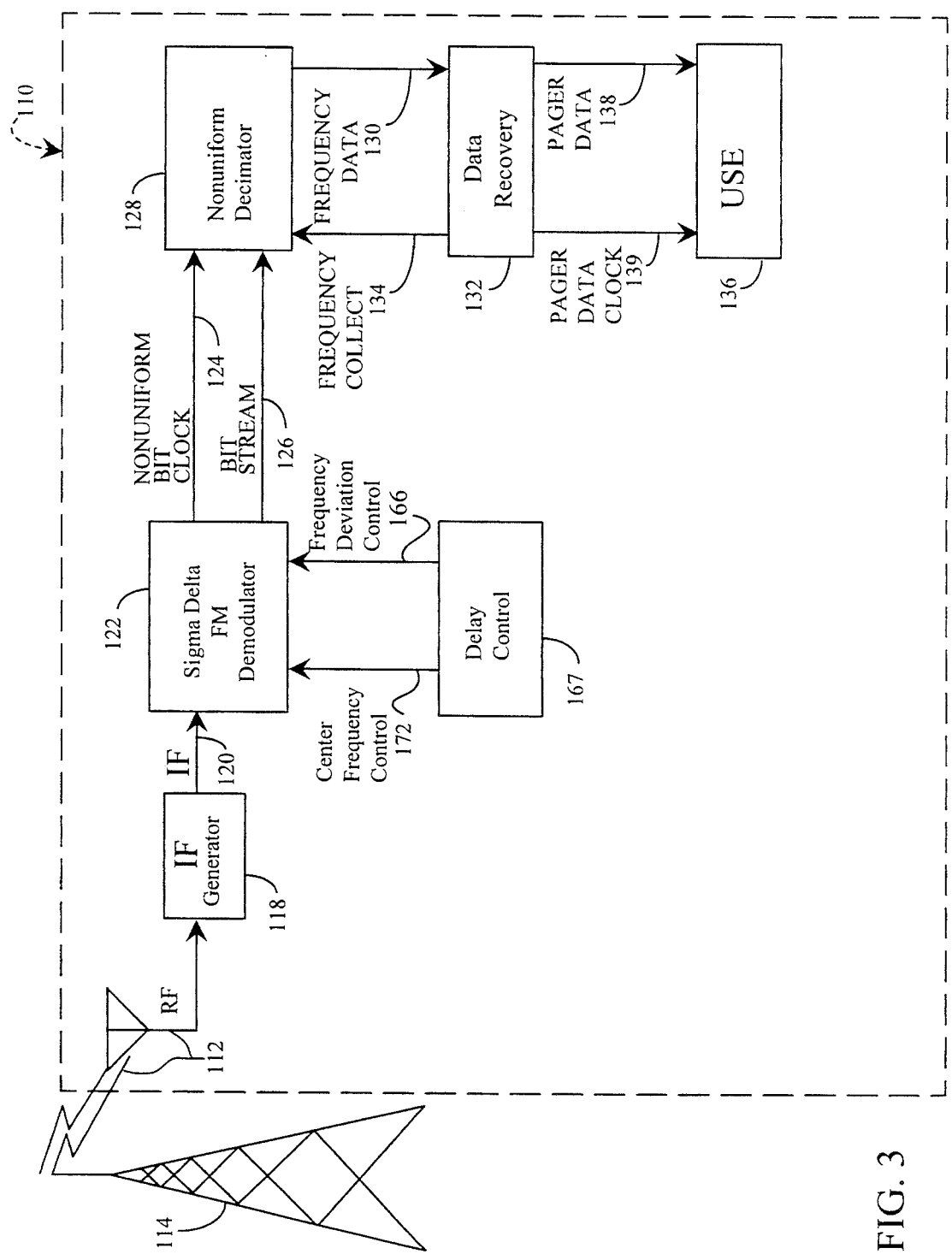
FIG. 3 is a block diagram of an FM radio signal receiving device including a sigma-delta digital FM demodulator in accordance with the present invention.

In FIG. 3, radio receiving device 110 collects an FM radio signal 112 as provided by FM radio signal source 114. For example, radio receiving device 110 might be a paging device with the FM radio signal 112 providing paging data collected, developed and broadcast by a paging system serving as the FM radio signal source 114. While the present invention will be described and illustrated in the context of a paging system, it will be understood that the present invention has applications beyond that of paging devices.

The FM radio signal 112 is first processed by the radio receiving device 110 in an intermediate frequency (IF) generator 118. Generator 118 corresponds to a conventional FM receiver up to, but not including, the discriminator circuit. As will be appreciated by those skilled in the art, IF signal 120 is a square wave signal corresponding in frequency to that of the FM radio signal 112, but mixed to the intermediate frequency and amplified until limiting occurs, thereby producing a signal with two amplitude values and transitions occurring at a fairly uniform rate according to signal frequency. Thus, the frequency of IF signal 120 is a function of the frequency of the FM radio signal 112, and provides a basis for FM demodulation. The IF signal 120 produced by IF generator 118 is applied to a sigma-delta digital FM demodulator 122 of the present invention.

The sigma-delta FM digital demodulator 122, described in more detail hereafter, produces a signal 120 frequency dependent, i.e., non-uniform, sample or bit clock signal 124 and a bit stream 126. The bit stream 126 provides a sequence of logic values, i.e., ones and zeros, and the sample clock 124 provides a basis for sampling values from the bit stream 126. A non-uniform decimator block 128 receives the non-uniform clock 124 and bit stream 126 and, based on the proportion of ones and zeros in bit stream 126, provides frequency data 130 to a data recovery block 132 upon activation of a uniform frequency collect signal 134. Data recovery block 132 uses conventional uniform sampling according to known digital signal processing (DSP) techniques to filter and recover a pager data stream 138 and a pager bit clock 139. A use block 136, which constitutes the bulk of the radio receiving device 110, interprets the pager data 138 and pager data bit clock 139 according to a given data protocol, and displays the paging messages according to a given user interface.

Figure 4:
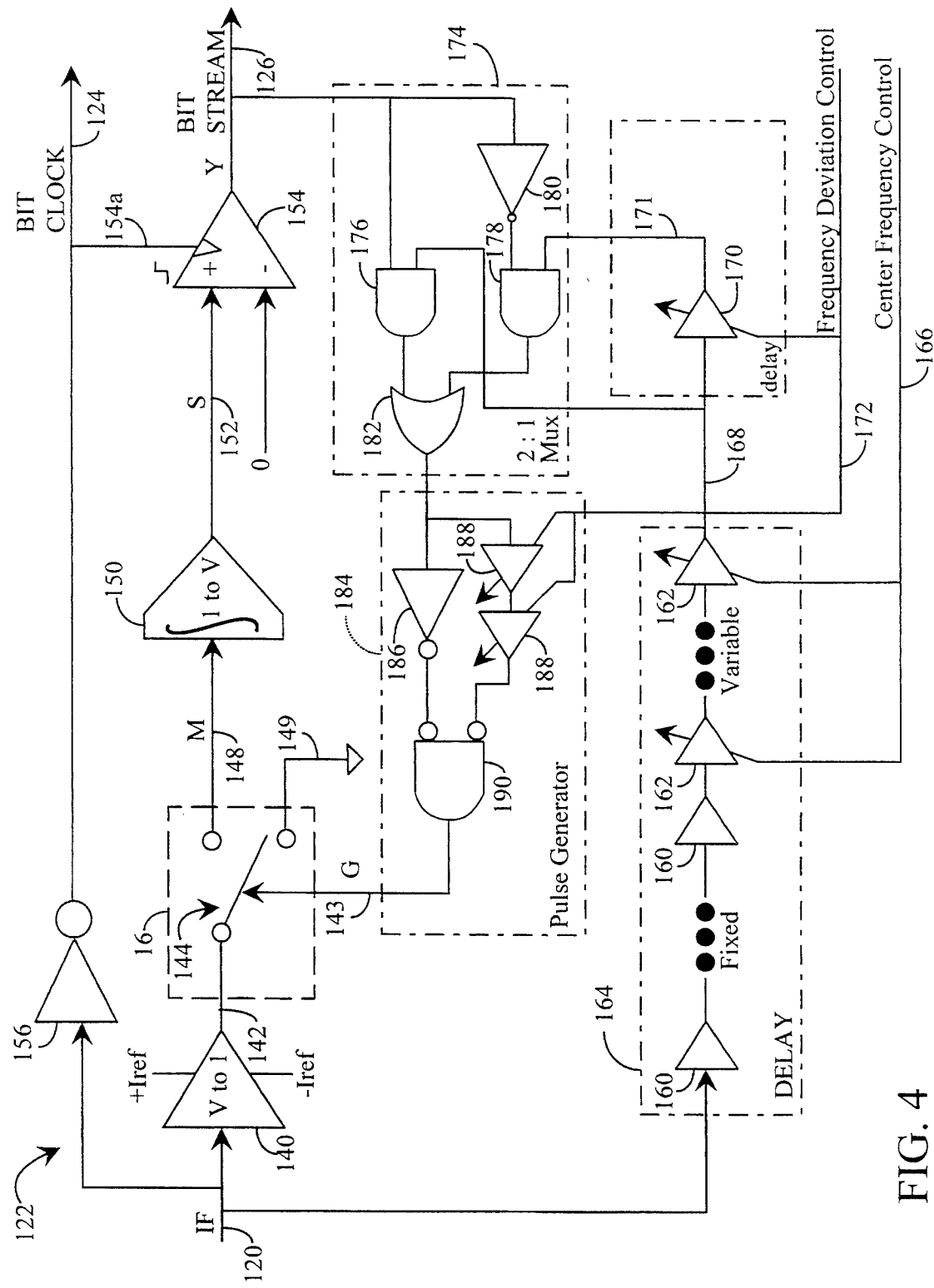
FIG. 4 is a block diagram illustrating in more detail the FM digital demodulator of FIG. 3.

FIG. 4 illustrates in more detail the digital demodulator 122. In FIG. 4, a voltage-to-current convertor 140 receives the IF signal 120 and produces an IF current signal 142. As may be appreciated, convertor 140 receives a positive and negative current reference, i.e., $+I_{ref}$ and $-I_{ref}$, and the IF current signal 142 moves between current values at positive $I_{ref}$ and negative $I_{ref}$ according to the state of the IF signal 120. More particularly, if the IF signal 120 is at logic one then the IF current signal 142 presents a positive $I_{ref}$ current as the IF current signal 142. Similarly, if the IF signal 120 is at logic zero then the IF current signal 142 presents a negative $I_{ref}$ signal as the IF current signal 142.

The IF current signal 142 is applied to the common node of FET switch 144. FET switch 144 corresponds to the multiplier 16 of FIG. 1. Under control of a gate signal 143, also designated G, the current signal 142 passes through switch 144 as a gated IF current signal 148, also designated M, or passes to an electronic ground 149. More particularly, if the gate signal 143 is low then the current signal 142 passes to ground 149 and gated IF current signal 148 is zero. If gate signal 143 is high then the current signal 142 passes through switch 144 as the gated IF current signal 148. Thus, gated IF current signal 148 has three states, zero if gate signal 143 is low, negative $I_{ref}$ if gate signal 143 is high and IF signal 120 is low, and positive $I_{ref}$ if gate signal 143 is high and IF signal 120 is high. As used herein, the terms "high" and "low" refer to logic value one and logic value zero, respectively.

Current integrator 150, providing a voltage output, continuously integrates the gated IF current signal 148 and provides an integrator voltage output 152, also designated S. The integrator output 152 represents an accumulated error value relative to selected anticipated times of transition in the IF signal 120 and actual transition times in the IF signal 120.

The integrator output 152 is applied to the positive terminal of a clocked comparator 154. The comparator 154 responds to the bit clock 124, i.e., performs its comparison function in response to transitions in bit clock 124. Bit clock 124 is an inverted form of IF signal 120, i.e., provided by means of an inverter 156. The negative terminal of comparator 154 receives a zero volt reference. Thus, comparator 154 determines the sign, i.e., positive or negative, of the integrator output 152 in response to the sample clock signal 124. Comparator 154 provides as its output the bit stream 126 where a value "one" represents a positive accumulated error and a value "zero" represents a negative accumulated error.

As explained more fully hereafter, frequency of the IF signal 120 is determined by monitoring positive going transitions, i.e., rising edges, in the IF signal 120. The comparator 154 responds to a rising edge at its clock input. To insure that comparator 154 performs its comparison when the gate signal 143 is low and when the integrator output 152 is stable, comparator 150 is clocked during negative going transitions, i.e., falling edges, in the IF signal 120. The IF signal 120 is applied, therefore, to inverter 156 and the output of inverter 156 is applied to the rising edge clock input 154a of comparator 154. Also, the output of inverter 156 serves as the sample clock signal 124 whereby falling edges in clock 124 correspond to sample points in the bit stream 126.

The output of comparator 154, i.e., the bit stream 126, selects one of two anticipated next transition times for application to the FET switch 144 in the form of a pulse of given width and timing relative to the previous actual transition in the IF signal 120. As described earlier, the center point of this pulse represents a selected anticipated next transition time in the IF signal 120. The pulses are produced by delaying the IF signal 120.

The IF signal 120 is applied to a first series of fixed delay gates 160. A second series of adjustable delay gates 162 completes a delay circuit block 164. The delay gates 162 receive in common the center frequency control signal 166. The function of delay block 164 is to provide a delay approximately equal to the time between a given transition in the IF signal 120 and the beginning of the window of valid next transitions in the IF signal 120 less half the gate pulse duration. The output 168 of delay block 164 is applied to a variable delay element 170, providing a delay on the order of $t_{delay}$, i.e., equal to or slightly greater than the window 208 of valid next transitions. The frequency deviation control signal 172 is applied to the delay element 170 for adjustment in the delay provided thereby.

A 2:1 multiplexer 174 receives the delay block output 168 and the output 171 of adjustable delay element 170. More particularly, AND gates 176 and 178 receive at respective first inputs thereof the delay block output 168 and the output 171 of delay element 170. The second input of AND gate 176 receives the bit stream 126. The second input of AND gate 178 receives an inverted form of the bit stream 126 by way of inverter 180. The outputs of AND gates 176 and 178 are applied to respective inputs of OR gate 182. The output of OR gate 182 serves as the output of the multiplexer 174. Thus, multiplexor 174 receives an early trigger in the form of delay block output 168 and a late trigger in the form of delay element 170 output 171. Multiplexor 174 selects among the two trigger events based on the state of bit stream 126. As may be appreciated, the early trigger from delay block output 168 produces an early gate G1 in the gate signal 143 and the late trigger originating from delay element 170 output 171 produces a late gate G0 in the gate signal 143. The early gate G1 precedes the late gate G0 by a time interval $t_{delay}$ as provided by the delay of delay element 170. It should be understood, however, that the early gate G1 and late gate G0 are not produced concurrently.

A pulse generator block 184 receives the output of OR gate 182, i.e., the selected gate trigger signal provided by multiplexer 174, at an inverter 186 and at the input of a first one of a series of two delay elements 188, each providing a delay on the order of $t_{delay}$ and receiving in common the frequency deviation control signal 172. The output of inverter 186 and that of the last delay element 188 are applied to the inverted inputs of an AND gate 190. The output of AND gate 190 is the gate signal 143. Thus, upon presentation of a rising edge from multiplexer 174, pulse generator 184 produces a pulse, i.e., an early gate G1 or a late gate G0, in the gate signal 143 corresponding in duration to the delay provided by the delay elements 188, i.e., a delay of two time intervals $t_{delay}$.

The output of the comparator 154, i.e., the bit stream 126, selects by means of logic gates 176, 178, 180, and 182 which of the two gate signals G1 or G0 will appear as a pulse in the gate signal 143 for operation of FET switch 144. Thus, if bit stream 126 is, at a given point, high then AND gate 176 will allow an early trigger and an early gate signal G1 results. If, however, bit stream 126 is low then AND gate 176 is disabled and AND gate 178 is enabled whereby a late trigger is allowed and a late gate signal G0 results. The resulting early gate G1 or late gate G0, i.e., pulses in the gate signal 143, are of the same duration but offset by one-half the pulse duration whereby the center point of the early pulse (G1) corresponds in time offset to the rising edge of the late pulse (G0) and the falling edge of the early pulse (G1) corresponds in time offset to the center point of the late pulse (G0). The center of each of pulse represents a selectable anticipated time of a next rising edge in the IF signal 120 relative to the previous rising edge.

Figure 5:
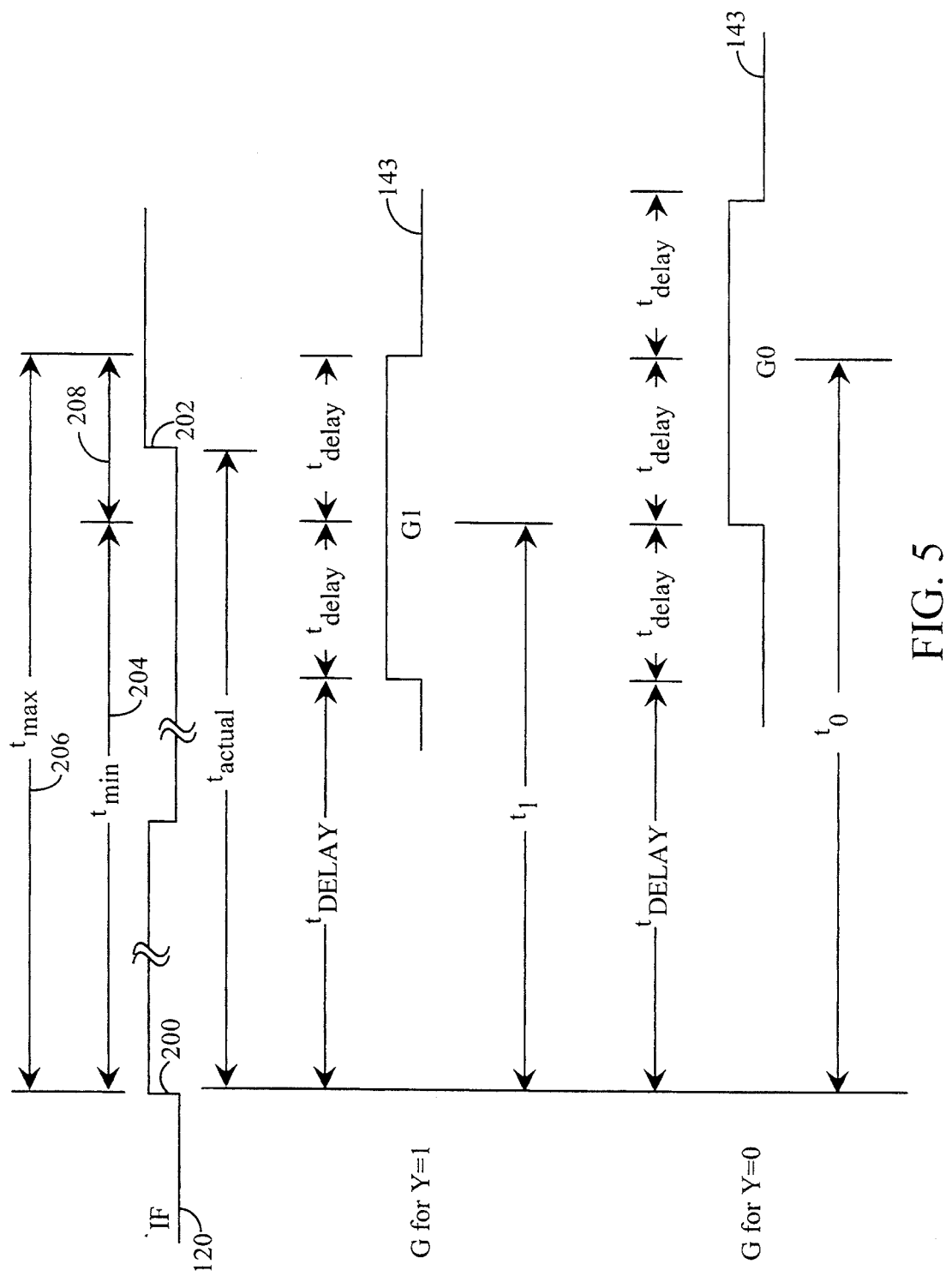
FIGS. 5 and 6 are timing diagrams illustrating operation of the sigma-delta FM digital demodulator of the present invention.

FIG. 5 illustrates the signal 143 early and late gate pulses, designated G1 and G0 in FIG. 5, relative to adjacent similar transitions in the IF signal 120. In FIG. 5, IF signal 120 is shown including a first rising edge transition 200 and a subsequent adjacent similar rising edge 202. The occurrence of rising edge 202 relative to rising edge 200 will be within a window of valid next transitions defined by a $t_{min}$ interval 204 and a $t_{max}$ interval 206. For standard FM broadcast with a 10.7 MHz IF signal, the IF signal 120 can vary in frequency between 10.6 MHz and 10.8 MHz. The valid transition window 208 corresponds to a 1.75 nS window 208 where the $t_{min}$ time interval 204 is approximately 92.59 nS and the $t_{max}$ interval 206 is approximately 94.34 nS.

Each of the gates G1 and G0 are of width corresponding to twice the delay period $t_{delay}$. This results from use of the pair of serially connected adjustable delay elements 188, each identical to element 170, in the pulse generator 184. The delay introduced by the inverter 186 can be considered negligible, or in a highly critical application can be matched by a second similar element placed in series with the pair of adjustable delay elements 188. The late gate signal G0 begins later than the gate signal G1 by a factor of delay interval $t_{delay}$ as a result of the use of delay element 170 as applied to the input of AND gate 178. While gates G1 and G0 are never produced concurrently, the overlap in time between gates G1 and G0 corresponds to the window 208. The anticipated time of next transition represented by the gate G1, i.e., the center point of gate G1, is just slightly ahead of the window 208, and the anticipated time represented by the gate G0 is just slightly after the window 208.

Figure 6:
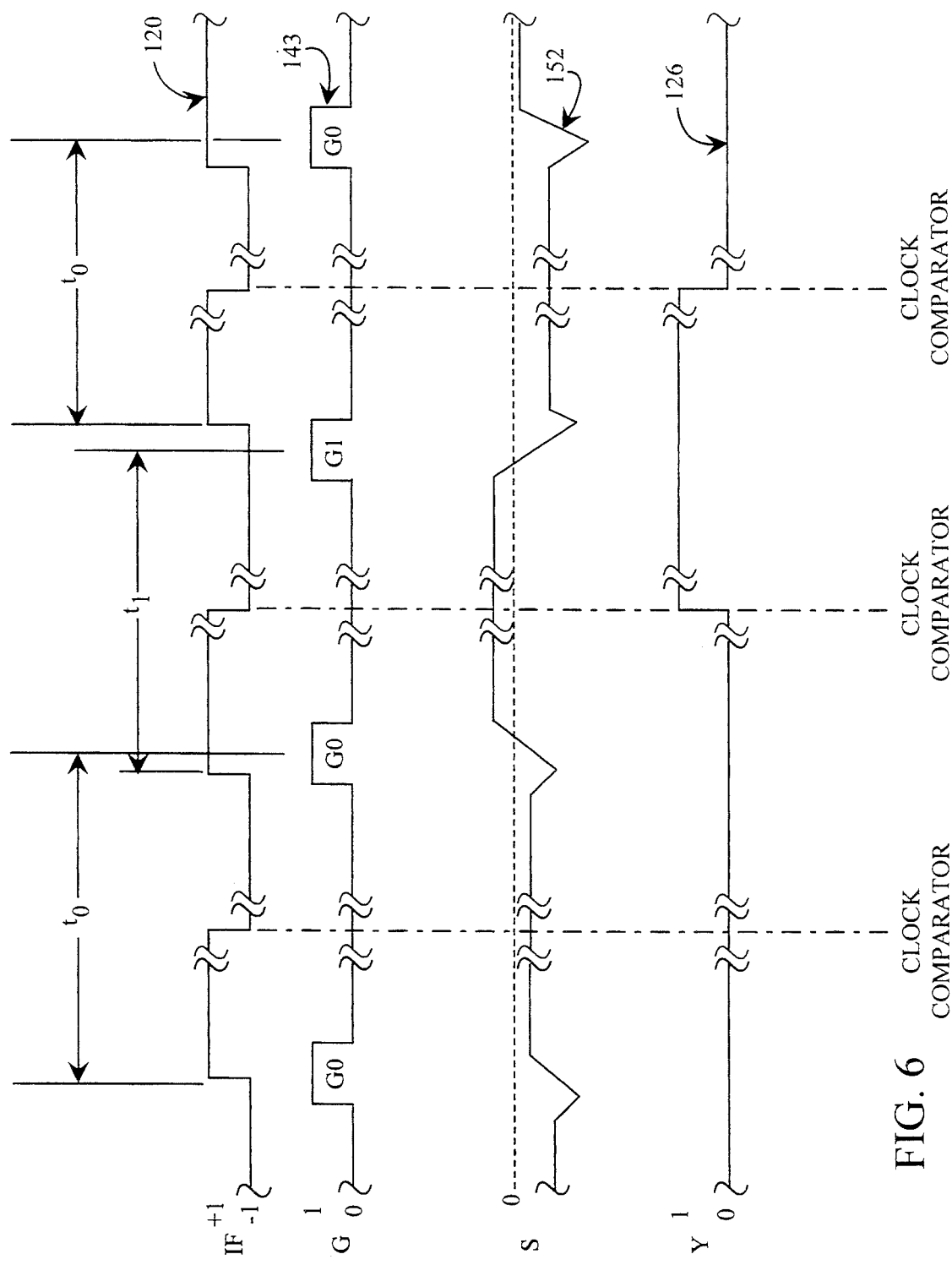

FIG. 6 illustrates various signals developed in the sigma-delta FM digital demodulator 122 for a given condition of the IF signal 120. In FIG. 6, the IF signal 120 presents a frequency wherein the next actual transition 202 (FIG. 5) occurs at a point two-thirds into the window of valid next transitions, i.e., two-thirds of the way from the time $t_1$ to the time $t_0$. Four cycles of circuit 122 operation are illustrated in FIG. 6. In the first cycle, the integrator output 152 is negative and the late gate G0 is selected for presentation in the signal 143 to the switch 144. The integrator output 152 then increases toward positive, but does not yet pass zero. Because the integrator output 152 is negative in this next cycle, the late gate G0 is again selected for application to the switch 144. In response, the integrator output 152 again moves in the positive direction, but this time passes zero and presents a positive voltage to comparator 154. In this next cycle, therefore, the early gate G1 is selected for application to the switch 144 and, in response thereto, the integrator output 152 moves in the negative direction.

In the illustrated example, the integrator output 152 barely moved into the positive region, and as a result of the application of early gate G1, returned to the negative region and caused selection in the next cycle of the late gate G0. Thus, a pattern of bit stream 126 output develops. In the purest sense, the bit stream 126 does not produce an output proportional to the frequency of the signal 120 but rather an output proportional to $t_{actual}$, the time between the chosen transitions 200 and 202 of the signal 120 (FIG. 5). By defining $t_{center}$ as the time halfway between the minimum anticipated time $t_1$ and the maximum anticipated time $t_0$, with a corresponding frequency of $freq_{center}$, and defining $t_{deviation}$ as the difference between $t_{actual}$ and $t_{center}$, a power series expansion can be made for the deviation of the frequency of signal 120 ($freq_{modulation}$), as a function of $t_{deviation}$:

$$freq_{modulation} = freq_{center}\{-(t_{deviation}/t_{center}) + (t_{deviation}/t_{center})^2 - \ldots\}$$

If $t_{deviation}$ is very much smaller than $t_{center}$, the square and higher order terms can be considered as negligible, and the deviation of the frequency of the signal 120 becomes proportional to the negative of $t_{deviation}$. If $t_{deviation}$ is not very much smaller than $t_{center}$, then a correction must be made to account for the higher order terms of the power series expansion to accurately demodulate an FM signal 120. This correction may be performed by the inclusion of a correction factor in the values stored in a look up table which is explained later.

In the example illustrated in FIG. 6, where the square and higher order terms can be considered negligible, the IF signal 120 has a frequency one-third of the way from the minimum allowed frequency to the maximum allowed frequency. This places the actual transition at two-thirds of the way into the window of valid transitions, which results in a repeating pattern of "001" appearing in the bit stream 126. This repeating pattern corresponds to a proportion of one-third, and thereby represents the frequency of IF signal 120 as being one-third of the way from the minimum allowed frequency to the maximum allowed frequency. As may be appreciated, however, more than three bits of information would normally be taken from the bit stream 126 in deriving frequency information, the particular example illustrated being of such nature that the pattern develops within three cycles of circuit operation.

Returning to FIG. 3, frequency deviation control signal 172 and center frequency control signal 166 correspond to frequency deviation control signal 23 and center frequency control signal 25 of FIG. 1. A delay control block 167 performs the algorithms used in manipulating the center frequency control signal 172 and frequency deviation control signal 166 as described above in connection with FIG. 1.

The bit stream 126 represents frequency information as a ratio of digital "one" values relative to the total number of digital "one" and "zero" values appearing in the bit stream 126. The sample clock 124 is a signal 120 frequency dependent clock providing a basis for extracting values from the bit stream 126. Thus, decimator block 128 develops the frequency data 130 by counting, during a given constant magnitude system synchronous time interval as driven by the system synchronous frequency collect signal 134, the total number of digital values "one" appearing in bit stream 126 as compared to the total number of cycles in the sample clock 124.

Figure 7:
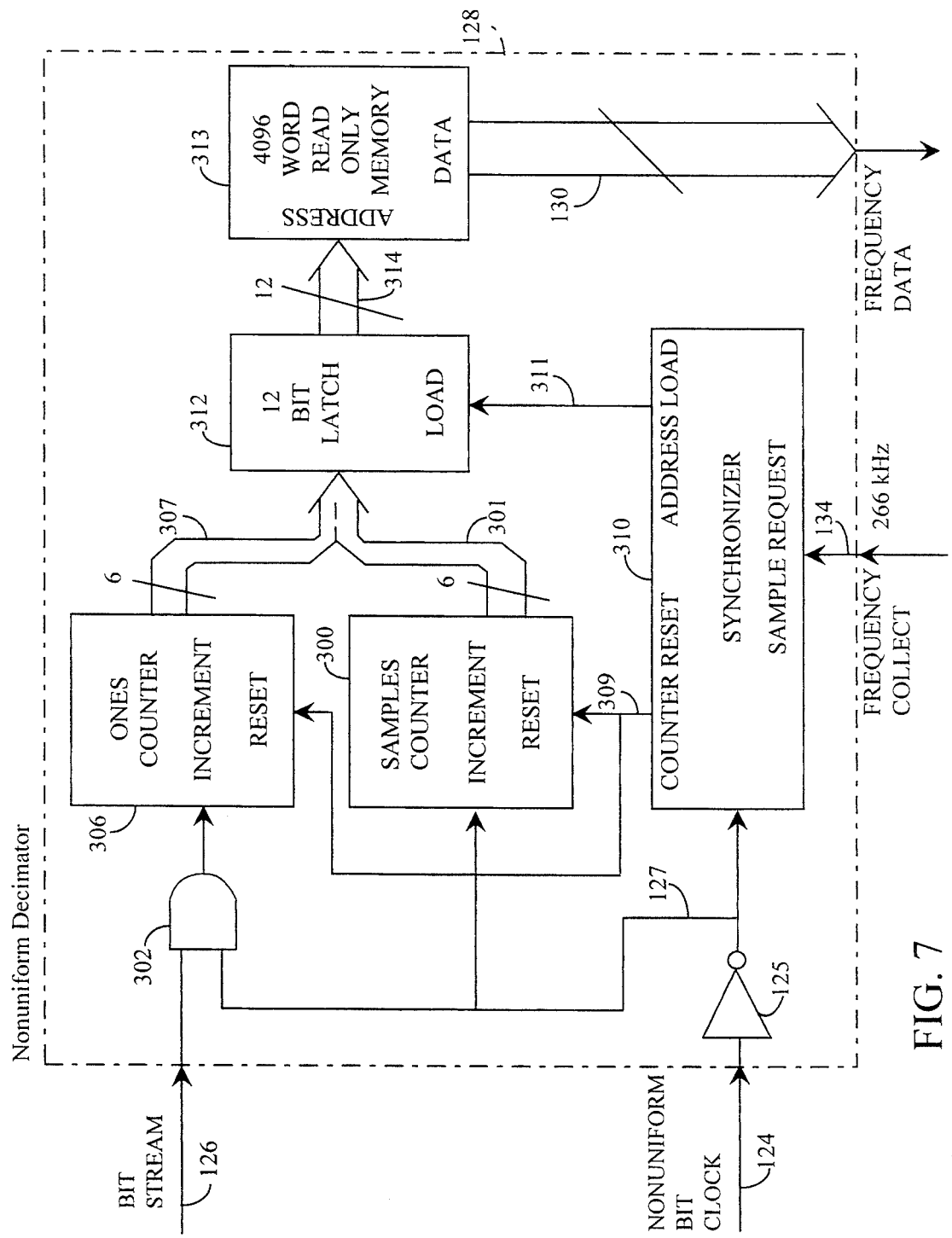
FIG. 7 is a block diagram of a decimator providing frequency information based on the output of the digital demodulator of the present invention.

FIG. 7 illustrates in more detail a preferred form of the decimator block 128. In FIG. 7, sample clock signal 124 is applied to inverter 125 producing inverted sample clock 127. Clock 127 is then applied to the increment input of a sample counter register 300. Thus, sample counter register 300 counts the number of cycles in the sample clock signal 124. The bit stream 126 is applied to a first input of an AND gate 302. The second input of the AND gate 302 receives the inverted sample clock 127. The output of AND gate 302 is applied to the increment input of a ones counter register 306. Thus, the increment input to the ones counter register 206 will cycle for each cycle in the sample clock signal 124 associated with a digital value "one" in the bit stream 126.

Each of registers 300 and 306 includes a reset input provided by a reset signal 309 of timing synchronization block 310. Timing synchronization block 310 receives the frequency collect signal 134, e.g., at 266 Khz, and the inverted sample clock signal 127. The frequency collect signal 134 is a system synchronous signal whereas the sample clock signal 124 and hence inverted sample clock 127 are system asynchronous signals, i.e., frequency dependent relative to the IF signal 120. Thus, timing synchronization block 310 resets the registers 300 and 306 in system synchronous manner and according to constant magnitude time intervals, but avoids transition conditions in bit stream 126 and clock 124.

Timing synchronization block 310 also applies an address load input 311 to a frequency look up table address latch 312. Thus, latch 312 collects the ones count 307 from register 306 and the samples count 301 from register 300 in response to the address load input 311. Frequency look up table 313 accepts as memory address data 314 the value held in latch 312 and provides as its output a corresponding frequency datum 130, e.g., a multiple bit frequency value. Thus, frequency look up table 313 should be constructed in such manner to provide a divide function relative to the data provided by registers 300 and 306. More particularly, the data stored in table 313 represents the result of the value held in ones counter register 306 divided by the value held in sample counter register 300. This division represents a number between zero and one and establishes the frequency of IF signal 120 by scaling the position of the transition 202 in the window 208 (FIG. 5).

Figure 8:
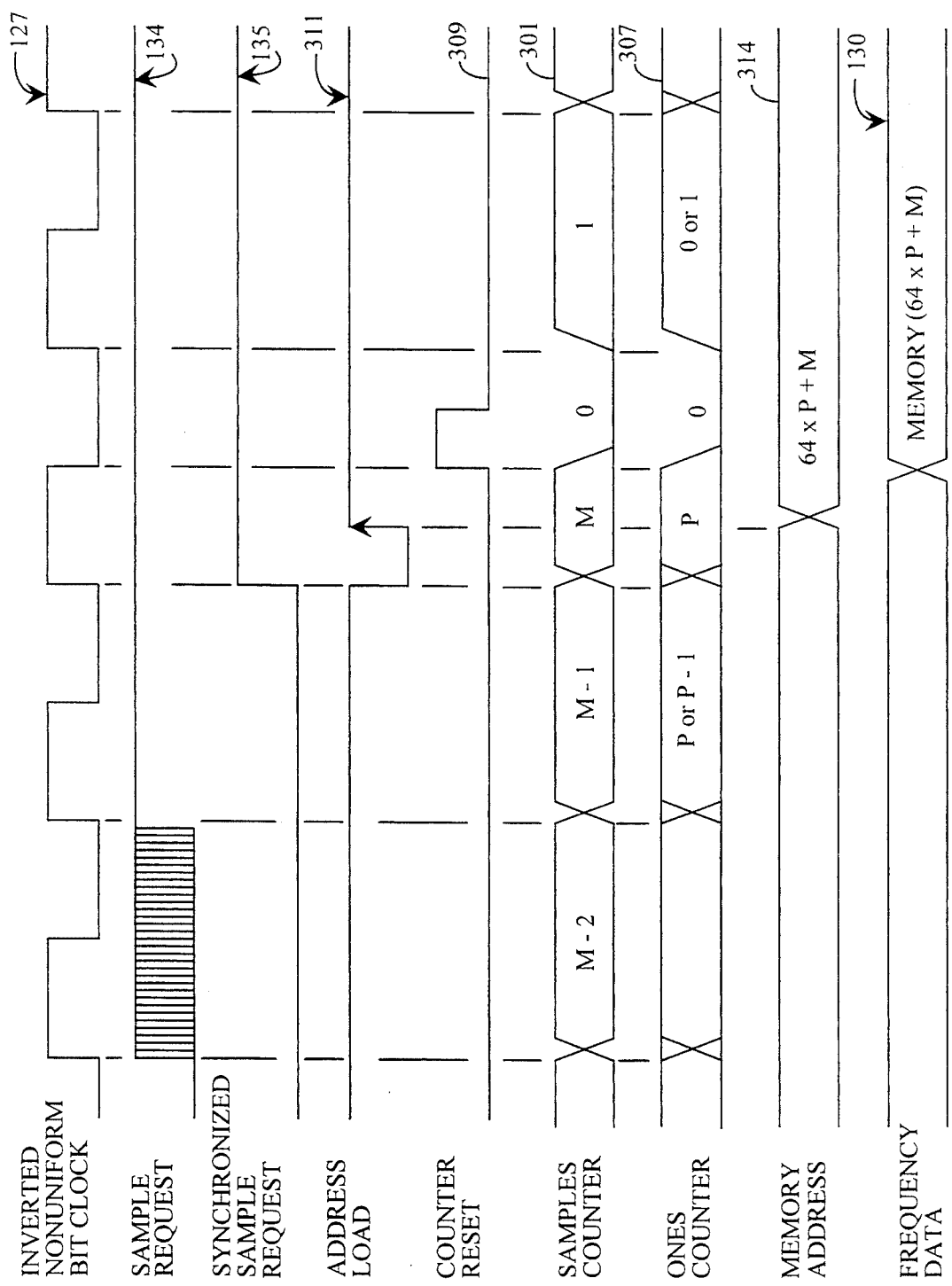
FIG. 8 is a timing diagram for the circuit of FIG. 7.

FIG. 8 illustrates various timing relationships between the signals of the circuit of FIG. 7 and should support, for one skilled in the art, implementation of the synchronizer 130. The synchronized sample request 135 is a signal generated by cascading two type D flip-flops clocked by non-uniform bit clock 127 and receiving as input the sample request 134. The variable M in FIG. 8 refers to the six bit value 301 taken from the samples register 300. The variable P refers to the six bit value 307 taken from the ones counter 306. As previously noted, the values M and P are joined to form an address applied to the look up table 313. The data stored in the corresponding address should represent a division of the variable P by the variable M. Such data could further include any correction factors considered necessary relative to circuit characteristics and especially those required to correct for the higher order terms of the power series mentioned earlier.

Figure 9:
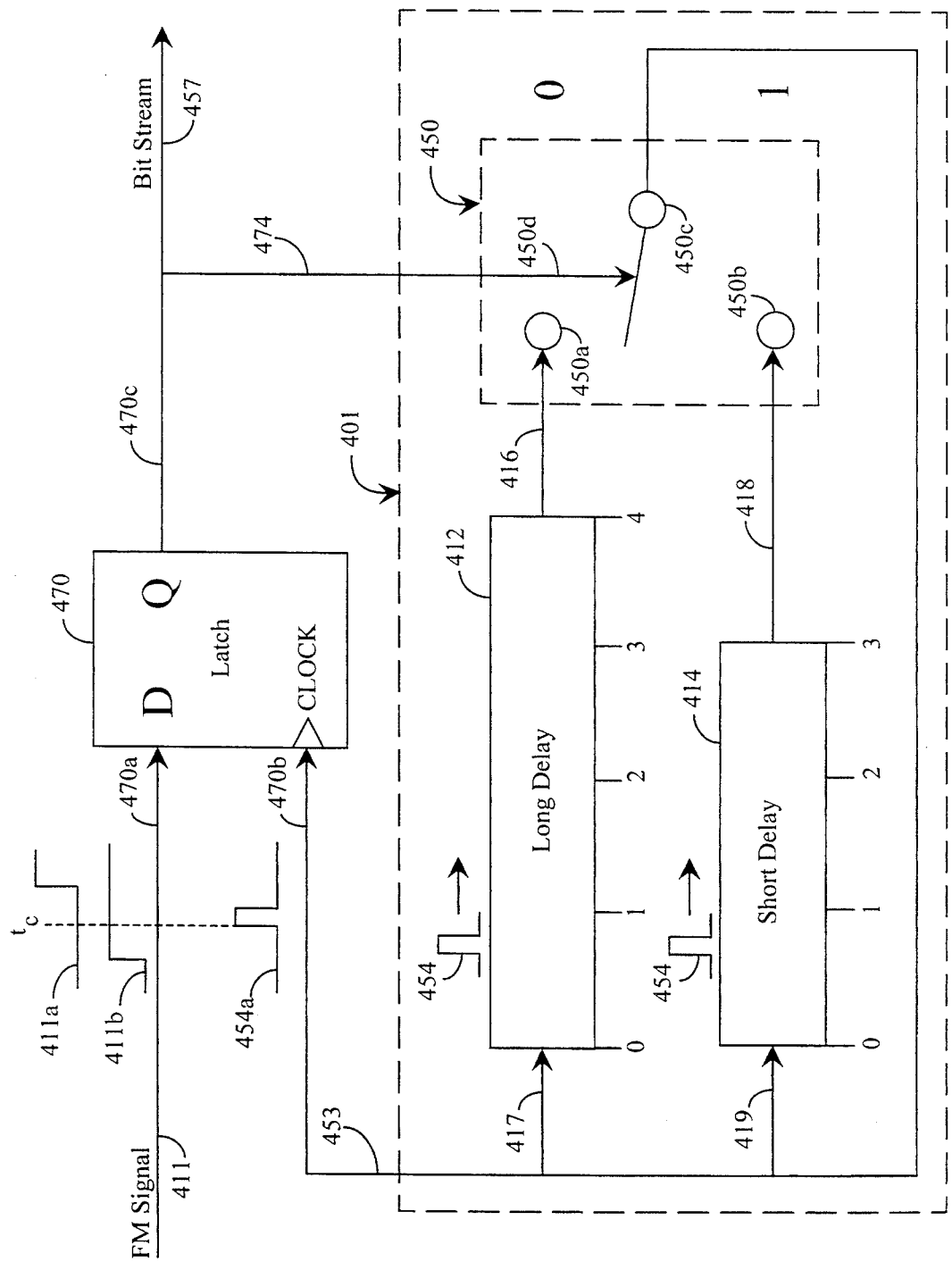
FIG. 9 is a simplified block diagram illustrating the theory of operation of an alternate digital demodulator of the present invention.
Figure 10:
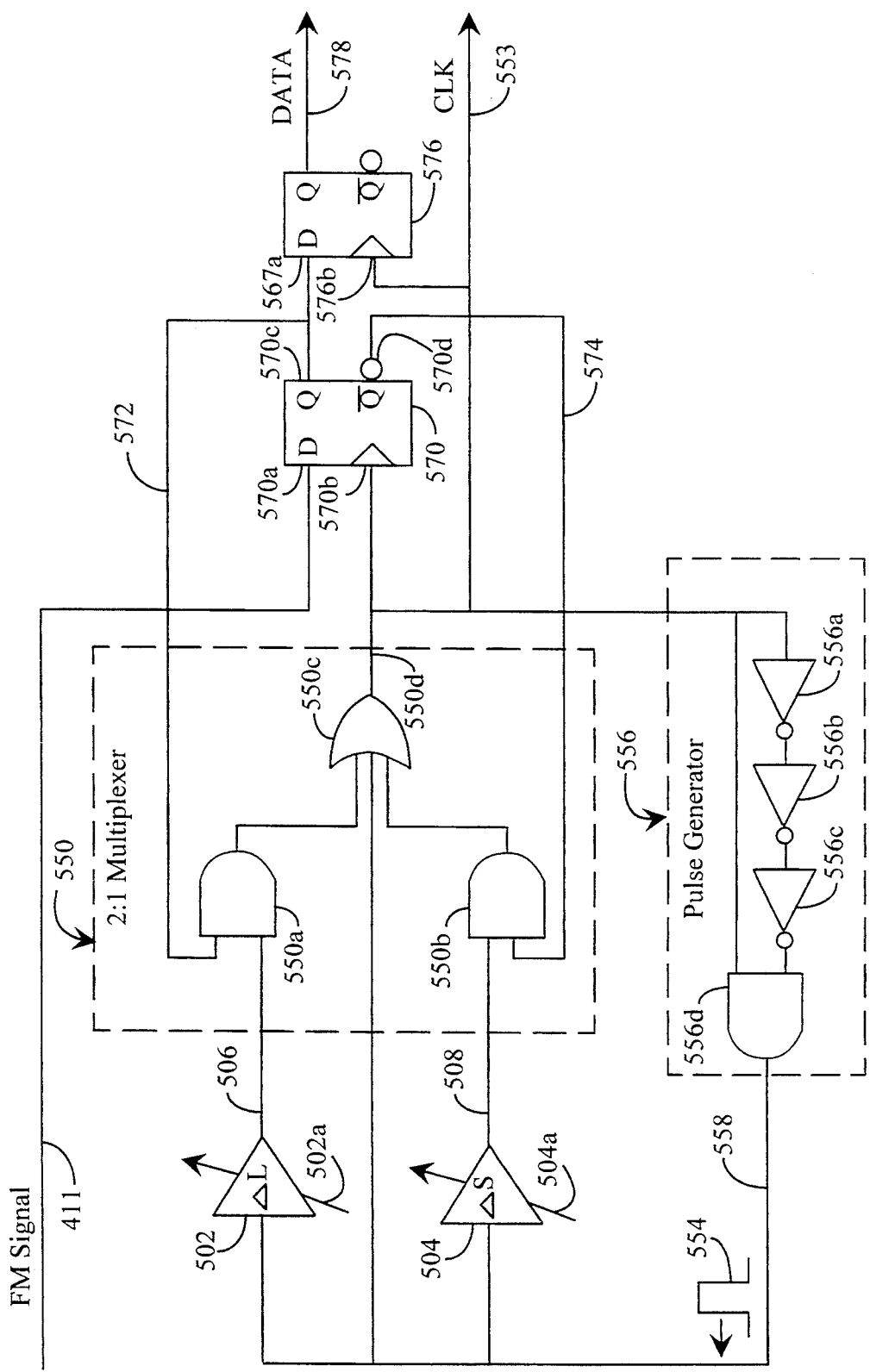
FIG. 10 is a logic block diagram schematic for an implementation of the demodulator according to the theory of operation as illustrated in FIG. 9.
Figure 11:
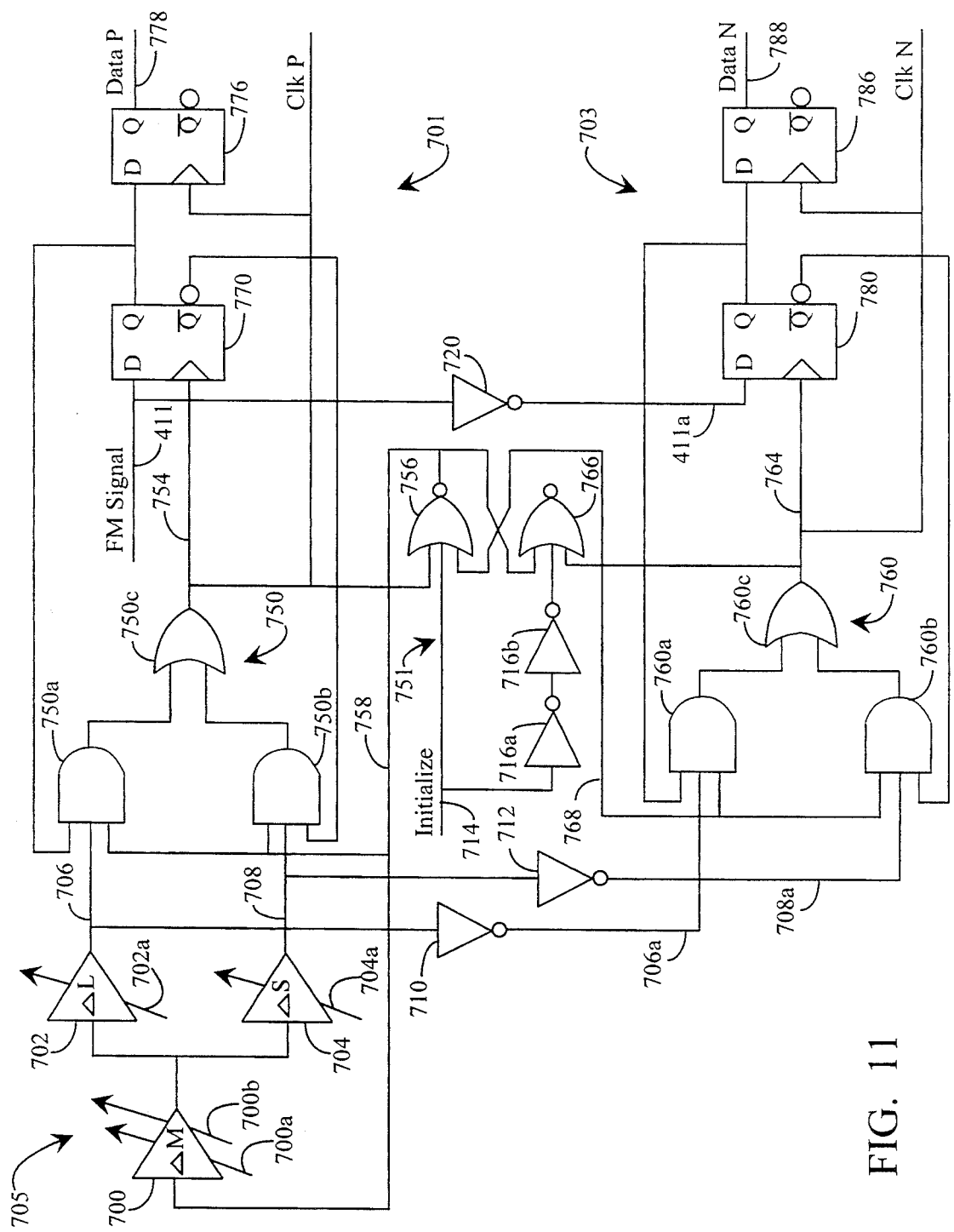
FIG. 11 is a logic block diagram schematic illustrating an improved implementation of a digital demodulator according to the theory of operation set forth in FIG. 9.

FIG. 9 is a simplified diagram illustrating an alternative embodiment of the present invention avoiding use of an analog device, e.g., an integrator, to represent an accumulated error in the sigma-delta FM demodulator. The illustration of FIG. 9 is not presented as an implementation design, but rather to illustrate the theory of operation for this embodiment of the present invention. FIGS. 10 and 11 illustrate implementation details for this form of the invention.

In each of the illustrations of FIGS. 9–11, the circuit produces as output a sequence of digital values, sampled by reference to a corresponding clock signal, representing a sequence of selections by the circuit between a short anticipated next FM signal transition and a long anticipated next FM signal transition. As described herein above, such a given sequence of output data provides basis for calculating a ratio, i.e., a given value in the data stream relative to the total number of samples in the data stream, to derive a representation of the frequency of the FM signal demodulated. In other words, each circuit provides output which may be then applied to a decimator circuit to derive an indication of frequency in a frequency range bounded by a high frequency associated with the short anticipated choice and a low frequency associated with the long anticipated choice.

It will be understood that the FM signal to be demodulated will vary in frequency according to the information carried thereby. Circuit operation will be described, however, assuming an interval of constant FM signal frequency with the understanding that the circuit will track changes in the FM signal frequency as a basis for collecting information carried by the FM signal.

In FIG. 9, a bi-frequency oscillator 401 includes a long delay block 412 and a short delay block 414. The long delay output 416 and short delay output 418 each apply to first and second inputs, 450a and 450b, respectively, of a switch 450. Switch 450 routes a selected one of the outputs 416 and 418 to switch output 450c. Switch output 450c applies in parallel to the inputs 417 and 419 of the long delay block 412 and short delay block 414, respectively, and also as the output 453 of bi-frequency oscillator 401. Switch 450 operates in one of two states as determined by its control input 450d, which is the frequency select input 474 of the bi-frequency oscillator 401. In a first state, long delay output 416 appears as the switch output 450c. In a second state, short delay output 418 appears as the switch output 450c. Thus, oscillator 401 may operate at a first frequency for a first state of input 450d and at a second frequency for a second state of input 450d. In operation, oscillator 401 carries a circulating pulse 454. Presentation of the pulse 454 at the oscillator output 453c occurs at one of two frequencies, i.e., depending on the state of oscillator input 474.

FM signal 411, equivalent to the above-described IF signal 120, i.e., a signal to be demodulated, applies to the D input 470a of a type D latch 470 and the oscillator output 453 applies to the clock input 470b of latch 470. The Q output 470c of latch 470 applies both as the oscillator input 474 and a demodulator output 457.

Certain assumptions with respect to the illustration of FIG. 9 establish operation. All components are considered to be ideal components. The latch 470 is assumed to be infinitely fast with no metastability constraints. The pulse 454 carried through the oscillator 401 may be taken as a zero duration pulse circulating around the dual-path loop of oscillator 401, i.e., a first path being through the long delay block 412 and a second path being through the short delay block 414. It is also assumed that within any given oscillator cycle, switch 450 will pass to its output 450c only a single pulse as selected from outputs 416 and 418.

In operation of the circuit of FIG. 9, if switch 450 is in its state zero position, i.e., coupling long delay output 416 to switch output 450c, the circuit selects the long delay and the pulse 454 occurs at the oscillator output 453 at the lesser magnitude frequency. Similarly, if switch 450 is in its state one position, i.e., coupling the short delay output 418 to the switch output 450c, then the pulse 454 appears at the oscillator output 453 at the greater magnitude frequency.

The choice between the lesser magnitude and greater magnitude frequency of operation for oscillator 401 is a function of the Q output 470c of latch 470. The Q output 470c of latch 470 represents the relative timing, i.e., early or late, of the pulse 454 at the oscillator output 453 relative to a transition of interest in the FM signal 411. Valid frequencies in the FM signal 411 are assumed to be between the greater magnitude frequency represented by short delay block 414 and the lesser magnitude frequency represented by the long delay block 412. The digital demodulator of FIG. 9 selects between two frequencies, i.e., two delay paths within oscillator 401, through negative feedback. The average frequency of operation for oscillator 401 may be taken as a weighted average of the greater magnitude frequency and the lesser magnitude frequency, i.e., a frequency somewhere between the lesser magnitude frequency associated with the long delay block 412 and the greater magnitude frequency associated with the short delay block 414.

For example, if FM signal 411 transitions of interest occur at a frequency with a period midway between that of the high frequency associated with short delay block 414 and that of the lower frequency associated with delay block 412, then the output 470c of latch 470 will be at state zero half the time and at state one the other half. Thus, a ratio of a given state value of Q output 470c to the total number of output values presented at Q output 470c over a given interval represents a frequency within a range of frequencies bounded by the higher frequency of short delay block 414 and the lesser frequency of long delay block 412.

Thus, the demodulator circuit of the present invention may be considered a time demodulator. For an FM signal with a deviation that is small compared to the average frequency, one can make an approximation that the linear time change is a linear frequency change. This approximation is supported by the approximation and mathematic methods for correction set forth herein above.

As illustrated in FIG. 9, the long delay block 412 provides four units of time delay whereas the short delay block 414 provides three time units of time delay. These delay intervals are selected for the purpose of illustration, and likely would not be employed in an actual implementation of this circuit. An actual implementation would often have a much smaller time differential between the long delay block 412 and short delay block 414 such as on the order of one percent. For example, if short delay block 414 provides 99 units of time delay then long delay block 412 provides 100 units of time delay.

By selecting the frequency of oscillator 401 during the next cycle with negative feedback from the current cycle, it can be assumed that at the end of the next cycle pulse 454 arrival at clock input 470d moves toward the next FM signal 411 transition arrival at D input 470a. The demodulator always moves toward and achieves a stable condition whereby pulse 454 is either retarded or advanced, i.e., by routing through the selected one of delay blocks 412 and 414, relative to the next occurrence of the FM signal 411 transition of interest. If the FM signal 411 transition occurs before the pulse 454, then the latch 470 receives at its D input 470a a value one when it is clocked by pulse 454. If the FM signal 411 transition occurs after the pulse 454, then the latch 470 receives at its D input 470a a value zero when it is clocked by pulse 454.

Consider, for example, the illustrated pulse 454a having a leading, rising edge at the time $t_c$. Also consider the illustrated FM signal transition 411a having a positive-going transition subsequent to the time $t_c$, and the FM signal transition 411b having a positive-going transition prior to the time $t_c$. In the case of FM signal transition 411a, where the leading edge of pulse 454a precedes the FM signal transition, latch 470 clocks in a value zero and presents at the next cycle of operation a value zero to the oscillator input 450d. As a result, the long delay output 416 will be selected by switch 450, thereby retarding the next occurrence of pulse 454 relative to the next occurrence of an FM signal 411 transition. In the case of FM signal transition 411b, where the leading edge of pulse 454a follows the signal transition, latch 470 clocks in a value one and presents at the next cycle of operation a value one to the oscillator input 450d. As a result, the short delay block 414 carries the pulse 454 next presented at the oscillator output 453, thereby advancing the next occurrence of pulse 454 relative to the next occurrence of an FM signal 411 transition.

Accordingly, depending on whether the circulating pulse 454 is ahead or behind an FM signal 411 transition of interest, the appropriate one of delay blocks 412 and 414 is selected to move the next pulse 454 toward the next FM signal 411 transition of interest. Eventually, a late circulating pulse 454 becomes an early pulse 454 and an early pulse 454 becomes a late pulse 454. In the next cycle of operation, the other delay block is selected to again move the next occurrence of pulse 454 toward the next FM signal 411 transition of interest, but in the opposite direction. Thus, switch 450 remains in a given state while the circulating pulse 454 moves toward the next FM signal 411 next transition of interest. Eventually the circulating pulse 454 moves past the next FM signal 411 transition of interest, and switch 450 changes state. Thus, the demodulator circuit of FIG. 9 operates in negative feedback fashion to maintain the occurrence of pulse 454 within a given proximity of the FM signal 411 transition of interest.

As an example, assume that the FM signal 411 has a constant frequency with a period of 3 and $\frac{2}{3}$ time units. Each time the long delay block 412 carries the pulse 454 presented to latch 470, the pulse 454 is retarded by $\frac{1}{3}$ time unit relative to the next transition in FM signal 411. Similarly, each time the short delay block 414 carries the pulse 454 presented to latch 470, the pulse 454 is advanced by $\frac{2}{3}$ time units. Allowing the circuit to operate for sufficient cycles will result in the long delay being selected twice as often as the short delay. Accordingly, this implies that the FM signal 411 has transitions with separation in time corresponding to a period of time units found at $\frac{2}{3}$ of the distance from the short delay to the long delay. Thus, for an FM signal of fixed frequency over a given time interval and a demodulator circuit of the present invention operating at a much higher clock rate than any modulation of the FM signal, one may validly assume or approximate the first order of the function of the circuit.

The following table illustrates operation of the circuit of FIG. 9 for an FM signal 411 period equalling 3 $\frac{2}{3}$ time units. Each row in the table corresponds to a time of FM signal 411 transition. The first column corresponds to sequential presentation of FM signal 411 transitions of interest. The second column indicates the position of the pulse 454 in the delay blocks 412 and 414 at the time of FM signal 411 transition of interest. The third column represents the selected state for switch 450 as a function of the relative timing of the FM signal 411 transition of interest and the pulse 454 presentation to latch 470. The fourth column indicates the delay path selected as a pulse 454 source for the next cycle. The fifth column provides calculation indicating the position of pulse 454 in time units upon arrival of the next signal 411 transition of interest.

| FM Transition No. | Circulating Pulse Position At FM Transition | Latch Output | Delay Selected For Next Cycle | Calculation Of Next Position |
|---|---|---|---|---|
| 1 | ½ | 0 | long | ½ + 3⅔ − 4 = 1/6 |
| 2 | 1/6 | 0 | long | 1/6 + 3⅔ − 4 = −1/6 |
| 3 | −1/6 | 1 | short | −1/6 + 3⅔ − 3 = ½ |
| 4 | ½ | 0 | long | ½ + 3⅔ − 4 = 1/6 |

In the illustrated example, at the time of the first FM signal transition, the circulating pulse 454 is arbitrarily located at ½ time unit in the long delay block 412 and short delay block 414. Accordingly, the pulse 454 has preceded the FM signal 411 transition of interest, thereby establishing a state zero for switch 450, selecting the next pulse 454 from the output 416 of the long delay 412. At the time of the second FM signal 411 transition of interest, the circulating pulse 454 resides at 1/6 time unit in the delay blocks 412 and 414, i.e., was retarded by ⅓ unit of time by virtue of switch 450 selecting the long delay output 416. Again, pulse 454 has preceded the FM signal 411 transition of interest, thereby maintaining switch 450 in its state zero position. Upon the third FM signal 411 transition of interest, the pulse 454 resides at −1/6 time units (alternately 3 5/6 time units) in the delay 412. Again, pulse 454 was retarded by ⅓ time unit. For this third transition, however, the pulse 454 follows the FM signal 411 transition of interest and switch 450 will be moved to its state one position to next select the pulse 454 from the short delay block 414. As a result, upon presentation of the fourth FM signal 411 transition of interest, pulse 454 is advanced by ⅔ time unit, i.e., is located at the ½ time unit in delay blocks 412 and 414. Since, under this example, the condition at the fourth transition is identical to that of the first transition, circuit output 457 is cyclical, i.e., repeating a pattern of "001." The ratio of zero values to total number of values is ⅔, and this implies a frequency in FM signal 411 corresponding to a period of 3 ⅔ time units.

While the above example establishes a repeating cycle within three iterations of circuit operation, it will be understood that a greater number of cycles would typically be required to establish a repeating pattern, and thereby a reliable representation of frequency in the circuit output 457.

As described herein above, sigma-delta frequency demodulation under the present invention stores an accumulated error following each crude estimate of a next anticipated transition of interest. Each crude anticipated time of transition is accepted, but the magnitude of error is carefully and accurately accumulated whereby, in conjunction with negative feedback, the error is forced to be zero over an extended interval. In the earlier embodiments, such error was accumulated in an analog device, e.g., an analog integrator. Error accumulation represented by the demodulator of FIG. 9 corresponds to the position of pulse 454 within the oscillator 401. This may be viewed as an analog storage of error, but an analog device need not be used in implementation of delay blocks 412 and 414. In an actual implementation by integrated circuit, the "position" of pulse 454 corresponds to the position of state transition within a series of gate delays.

Thus, the sigma-delta FM demodulator of the present invention may be improved by eliminating the use of an analog device, e.g., analog integrator, to store an accumulated measure of error in selected anticipated times of next FM signal transition. Under such improvement, one need not store an analog measurable quantity, but rather may advantageously represent error in an analog fashion by virtue of a position along a digital delay element. Thus, it is not the voltage of a pulse or the length of a pulse which stores accumulated error, but rather the position of a pulse within a digital delay line.

The subsequent illustration and description of FIGS. 10 and 11 provide further implementation details based on the theory of operation represented by the illustration of FIG. 9.

FIG. 10 is a logical schematic for an implementation of the circuit illustrated generally in FIG. 9. In FIG. 10, the latch 570 corresponds to the latch 470 of FIG. 9. The 2:1 multiplexor 550 corresponds to the switch 450. The variable long delay element 502 corresponds to the long delay block 412 of FIG. 9 and the variable delay element 504 corresponds to the short delay block 414 of FIG. 9. Delay adjustment controls 502a and 504a correspond to center frequency and frequency deviation controls as described herein above. The embodiment of FIG. 10 further includes a pulse generator 556. Pulse generator 556 keeps a circulating pulse 554 from either slowly shrinking to nothing or slowly expanding to fill the entire delay window. Important to note, the illustration of FIG. 10 includes no initialization components required to bring the circuit to a cleared and known state to start the initial pulse 554 circulating. The illustration of FIG. 10 is intended to show, therefore, operation of the demodulator after initialization.

Pulse generator 556 receives as a trigger the leading edge of the pulse 554 provided by multiplexor output 550d. Pulse generator 556 includes a series of delay inverters 556a, 556b, and 556c. The trigger applies directly to a first input of an AND gate 556d, and indirectly to a second input of AND gate 556d by way of the series of delay inverters 556a–556c. Thus, the pulse 554 of width corresponding to the delay provided by series delay inverters 556a–556c appears at the pulse generator output 558 in response to presentation of the leading edge of pulse 554 from the multiplexor 550. In this manner, pulse generator 556 regenerates a pulse 554 of stable width upon each cycle of demodulator operation. The pulse generator output 558 is applied to one input of the mutiplexor OR gate 550c. This forces the output of the multiplexor 550d to remain in the logic one state for the duration of the generation of pulse 554. The duration of pulse 554 is chosen to be both greater than the difference between the long delay 502 and the short delay 504 and greater than the total delay through latch 570 and gates 550a or 550b. By choosing the duration of the pulse in this manner, it can be assured that any remaining pulse 454 held in the long delay 502 and that any switching transients caused by a state change of the latch 570 have subsided before the multiplexor output 550d transitions to the state zero, thus eliminating the possibility of incorrectly triggering pulse generator 556.

The pulse generator output 558, i.e., the pulse 554, applies in parallel to the inputs of delay elements 502 and 504. The corresponding outputs 506 and 508 of delay elements 502 and 504 apply to the first and second inputs of multiplexor 550. More particularly, multiplexor 550 includes AND gates 550a and 550b, with the delay output 506 applied to a first input of AND gate 550a and the delay output 508 applied to a first input of AND gate 550b. The outputs of AND gates 550a and 550b are applied to corresponding inputs of an OR gate 550c providing as the multiplexor output 550d the circulating pulse 554. The second input of AND gate 550a receives the Q output 570c of latch 570 and the second input of AND gate 550b receives the inverse Q output 570d of latch 570. Thus, the state of latch 570 dictates which of AND gates 550a and 550b will be enabled, and therefore which of the delay outputs 506 and 508 will be passed through the multiplexor 550.

Latch 570 provides its Q output 570c to a D input 576a of a latch 576. A clock input 576b of latch 576 receives the multiplexor output 550d. Thus, both latches 576 and 570 are clocked sychronuously. Latch 576 provides at its Q output demodulator output as data 578 representing a sequence of choices, early or late, for anticipated next transition in FM signal 411. The output 550d of multiplexor 550, i.e., carrying the circulating pulse 554, is presented as the demodulator clock output 553.

The embodiment of FIG. 10 addresses the issue of metastability in the latch 570 by use of latch 576. If the clock, i.e., pulse 554 as delivered by multiplexor 550, arrives at the clock input 570b of latch 570 when the D input 570a is unstable, i.e., during transition in the FM signal 411, metastability in the latch 570 may result. Thus, if the FM signal 411 is in transition upon arrival of the leading edge of pulse 554 at the clock input 570b, the latch 570 may break into oscillation. Since the transition in FM signal 411 is very close to the arrival of pulse 454, i.e., representing essentially a zero magnitude error in the last estimate of arrival for the transition in signal 411, the next state choice for multiplexor 550 may be arbitrary. If there is metastability in latch 570 beginning with presentation of pulse 554 at the clock input 570b, such metastability will have at least the period of delay provided by short delay element 504 to cease oscillation before the pulse 554 can reach the AND gate 550b. Accordingly, so long as the latch 570 oscillation ceases within the short delay interval of element 504, multiplexor 550 input selection will be stable when the pulse 554 exits from one of the delay blocks 502 or 504.

While metastability, according to very small probability, may last indefinitely, there is a much greater likelihood that oscillation will stop prior to the next presentation of pulse 554 at the clock input 570b of latch 570. Because the output of latch 570 should by this time be stable, the latch 576 should virtually never enter a metastable condition because its D input 576a should always be stable whenever the pulse 554 arrives at its clock input 576b. Thus, so long as the metastability period of latch 570 is less than the delay provided by delay element 504, then the data 578 should be well within any timing bounds of allowed data error and should not affect the overall performance of the demodulator.

Thus, one use of clock 553, i.e., the pulse 554 as presented by multiplexor 550, is to avoid passing any metastable oscillations of latch 570 onto demodulator output data 578. While the additional latch 576 does introduce an additional delay in data 578 presentation, it avoids instability on the data output 578.

In operation of the demodulator of FIG. 10, the pulse generator 556 activates by a rising edge on multiplexor 550 output 550d, i.e., the rising edge in pulse 554. This generates a positive-going pulse of width corresponding to the delay through inverters 556a–556c. The actual width of the pulse provided by pulse generator 556 is immaterial so long as it is shorter than the delay provided by short delay element 504 and greater than the limits set forth above. The important timing aspect of the pulse 554 provided by pulse generator 556 is the rising edge thereof, and not its width. The rising edge of pulse 554 as provided by pulse generator 556 ultimately triggers the latch 570. Thus, the decision made by latch 570 occurs at the rising edge of its clock input 570b. This rising edge also retriggers pulse generator 556. The total delay of this rising edge as it circulates passing through AND gate 556d and then one of the two delay elements 502 and 504 and through the selected path in multiplexor 550 is the frequency determining feature of the demodulator of FIG. 10, i.e., one of two frequencies selected according to the state of multiplexor 550.

The output data 578 and clock 553 of the demodulator circuit of FIG. 10 may then be applied as a representation of the current frequency of FM signal 411 as described herein above, i.e., applied to a decimator circuit to calculate a ratio of certain state values in the output data 578 to the total number of values presented output data 578. This ratio indicates an FM signal 411 frequency in a range of frequency beginning with a low frequency associated with the long delay element 502 and a high frequency associated with the short delay element 504. Thus, over a given interval, a sequence of values taken from output data 578, sampled as a function of clock signal 553, establishes the frequency of FM signal 411 over that interval. As the FM signal 411 changes frequency, subsequent sampling intervals of the data output 578 according to clock 553 track FM signal 411 frequency.

FIG. 11 is a logic diagram of an enhanced implementation of the present invention corresponding to that of FIGS. 9 and 10. The embodiment of FIG. 11 advances the circuit of FIG. 10 in two aspects.

First, instead of using a circulating pulse travelling in a loop including a selected long and short delay path, the circuit of FIG. 11 references a signal edge transition travelling within a loop having selected long and short delay paths. Furthermore, the circuit of FIG. 11 utilizes both the positive-going transition and the negative-going transition of the FM signal 411. The circuit of FIG. 11 includes two demodulator circuits, 701 and 703, each corresponding to the circuit of FIG. 10. Circuit 701 demodulates with reference to positive-going FM signal 411 transitions and circuit 703 demodulates with reference to negative-going FM signal 411 transitions. The FM signal 411 applies directly to the positive-going transition circuit 701 and indirectly by way of inverter 720 to the negative-going transition circuit 703. In this manner, both demodulator circuits 701 and 703 actually reference positive-going transitions and may be identically constructed.

A second aspect of the demodulator of FIG. 11 relative to that of FIG. 10 is the inclusion of initialization circuitry to establish an appropriate state of operation at the onset of FM signal 411 demodulation.

The positive-going transition demodulator circuit 701 includes a switch 750 comprising the gates 750a, 750b, and 750c of similar arrangement to the multiplexor 550 of FIG. 10. Demodulator circuit 701 further includes latches 770 and 776 corresponding to the latches 570 and 576 of FIG. 10. Similarly, demodulator circuit 703 includes a switch 760 comprising gates 760a, 760b, and 760c corresponding to the multiplexor 550 of FIG. 10 and a pair of latches 780 and 786 corresponding to the latches 570 and 576 of FIG. 10. Circuit 701 and 703 operate alternately as RS flip-flop 751 alternately enables the switches 750 and 760.

RS flip-flop 751 includes a pair of NOR gates 756 and 766 each receiving at a first input thereof a corresponding one of the switch 750 and 760 outputs. A second input of each of NOR gates 756 and 766 receives an initialize signal 714, the initialize signal 714 being applied directly to the NOR gate 756 and indirectly to the NOR gate 766 by way of a pair of inverters 716a and 716b. The output of NOR gate 756 applies to a third input to NOR gate 766 and the output of NOR gate 766 applies to a third input of NOR gate 756.

The AND gates of switches 750 and 760 include an additional input driven by corresponding ones of the NOR gates 756 and 766 outputs as a mechanism for alternately enabling the switches 750 and 760. Accordingly, the output of NOR gate 756 applies to the third input of the AND gates 750a and 750b and the output of NOR gate 766 applies to the third input of AND gates 760a and 760b. Because the NOR gates 756 and 766 always have opposite outputs during operation, only one of the demodulating circuits 701 and 703 will be enabled at any given time.

The output of NOR gate 756 also applies to a delay network 705 and, as described hereafter, initiates circuit operation by presenting a positive edge transition to delay network 705. Delay network 705 consists of a major delay element 700 providing its output in parallel to a long delay element 702 and a short delay element 704. The outputs 706 and 708 of delay network 705 apply directly to the switch 750, and indirectly to the switch 760 by way of inverters 710 and 712. In this manners a positive edge transition emerging from delay network 705 is presented directly to the demodulating circuit 701, and a negative edge transition emerging from the delay network 705 is converted to a positive edge transition by inverters 710 and 712 for presentation to the demodulating circuit 703.

Delay element 700 includes a positive transition delay control 700a and a negative transition delay control 700b. Delay element 700 may be implemented as a series of gate elements. The delay through a gate for a positive transition is not necessarily equal to the delay through a gate for a negative transition. However, such delays through a given gate may be individually controllable. Accordingly, by use of delay controls 700a and 700b delay provided by major delay element 700 may be adjusted somewhat independently with respect to delay of a positive transition and delay of a negative transition. As a practical matter, all that is required is that control 700a has a greater effect on rising transitions and that control 700b has a greater effect on falling transitions.

The delay controls 700a and 700b of major delay element 700 are provided as an automatic center frequency control mechanism. As discussed herein above, by observing the data provided by the demodulator circuit, i.e., data P output 778 and data N output 788, a long term average may be established for these values and forced to zero by using negative feedback on the controls 700a and 700b. For example, if over an extended period more values one are found in the data output than values zero, then the delay element 700 will be altered (made shorter) to favor more values zero. Thus, the major delay controls 700a and 700b may be operated dynamically to control the positive-going transition delay and negative-going transition delay, respectively. Delay controls 702a and 704a for the delay elements 702 and 704, respectively, operate to set the gain of the demodulator circuits. In other words, to control the frequency deviation or extent of frequency excursion permitted in the FM signal 411. These controls are set through methods similar to that described above wherein circuit output of the decimator is forced to a certain excursion range, e.g. ¾ full scale, over a long period of time. If the range of the output signal is less than ¾ scale, then controls 702a and 704a are adjusted such that the delays move closer together which will cause smaller delay difference between 702 and 704 and thereby cause a wider range of one values and zero values in the circuit output for similar deviations in FM signal 411. Similarly, if the frequency range excursion begins to exceed ¾ scale, e.g., becomes all ones or all zeros for an extended time indicating that the FM signal is at a frequency outside the range allotted by the difference between delay provided in elements 702 and 704, then controls 702a and 704a are increased. This lowers the gain of the FM signal demodulator and brings the signal within the frequency range of the demodulator as established by the delay elements 702 and 704.

The center frequency function provided by controls 700a and 700b may be operated dynamically as an ongoing process. As an independent process controls 702a and 704a may be operated dynamically, or may be established during an initial adjustment phase and then locked in position during circuit operation.

The output of delay element 700 applies to the input of a long delay element 702 and short delay element 704. Each of delay elements 702 and 704 include corresponding delay controls 702a and 704a. In the case of delay elements 702 and 704, the positive transitions and negative transitions are delayed nearly equally. Accordingly, only a single delay control is shown for each of the delay elements 702 and 704.

No pulse generator is required because the circuit triggers in response to positive and negative transitions cycling through the circuit. Thus, as the FM signal 411 presents alternating positive-going and negative-going transitions, with every positive-going transition the demodulator circuit 701 operates to select a shorter or longer delay at switch 750 for the positive-going transition emerging from the delay network 705. For each negative-going transition, the same occurs at switch 760 in demodulator circuit 703 for negative transitions emerging from delay network 705. RS flip-flop 751 toggles between the positive transition mode and the negative transition mode. The RS flip-flop 751 reflects which of the demodulator circuits 701 and 703 are enabled and drives the switches 750 and 760.

Demodulating both positive-going and negative-going transitions in the FM signal 411 improves the signal-to-noise power ratio. If one assumes that noise on the positive-going transition of signal 411 or generated by demodulator 701 is uncorrelated with noise on the negative-going transition or generated by demodulator 703, the noise in each of the demodulators 701 and 703 outputs is independent. In a practical implementation, inconsistency of delay in delay network 705 represents a source of noise relative to the demodulated signal. Accordingly, consistency in delay intervals from cycle to cycle represents an important design criteria. The data P output 778 and data N output 788 are correlated with respect to signal but not necessarily correlated with respect to noise. This feature establishes a 3 decibel signal-to-noise advantage by performing an additive summation of the data P output 378 and data N output 788. Circuits 701 and 703 are quasi-independent demodulators, but are linked to the extent that FM signal 411 always has a positive-going transition between every two adjacent negative-going transitions and a negative-transition between every two adjacent positive-going transitions. Thus, the demodulator circuits 701 and 703 are not totally independent in that one will operate then toggle operation to the other one. Circuit operation constantly toggles back and forth with alternating assertion of the clock P signal 754 and clock N signal 764. By applying an additive sum function to the data P output 778 and data N output 788, four times more signal power results as the correlated signal adds, however, only two times more noise power results as the uncorrelated noise adds. Thus, a relative drop of 3 db in noise may be obtained by the additional use of a small number of gates implementing a second demodulator circuit demodulating an opposite-going transition in the FM signal 411.

To perform an additive sum function on the outputs of demodulator circuits 701 and 703, the total number of values one in the data P output 778 is added to the total number of values one in the data N output 788. The total number of clock transitions in the clock P 754 is added to the total number of transitions in the clock N 764. A ratio of the total number of values one in outputs 778 and 788 to the total number of clock transitions in clocks 754 and 764 provides a basis for determining frequency within a range represented by a low frequency associated with the delay element 702 and a high frequency associated with the delay element 704. As may be appreciated, the summing of the total number of values one in outputs 778 and 788 and the summing of the total number of transitions in clocks 754 and 764 may be performed by an intermediate circuit between the demodulator of FIG. 11 and a decimator circuit as described above, i.e., providing indication of frequency within a given range of frequency based on a calculated ratio of values one to the total number of values presented.

Initialization of the demodulator of FIG. 11 begins by bringing high the initialize input 714. This forces both gates 756 and 766 to a low output condition. Generally, this brings the entire demodulator circuit into a stable state. All the delay elements have low outputs and, generally, the gates will have low outputs and the clock signals 754 and 764 will be low. Thus, by holding initially high the initialize signal 714 for a given amount of time, the demodulator circuit of FIG. 11 is taken to a known, stable state. The initial state of D latches 770, 776, 780, and 786 is unimportant.

FM signal 411 demodulation begins when the initialize signal 714 is removed, i.e., taken low. Delay gates 716a and 716b delay this transition in the initialize signal 714 relative to the input of gate 766. This causes an initial condition in the RS flip-flop 751 where the output of gate 766 remains low and the output of gate 756 transitions to high. This ensures that when the initialize signal 714 goes low, the output of gate 756 will go high. This important transition drives the circuit into operation. The output of gate 756, being driven immediately high, will arrive at the input of gate 766 before the output of the delay gate 716b goes low. Accordingly, gate 766 will not change state and its output will remain low until later when events ripple through the circuit as described hereafter.

As noted above, the important transition in driving the demodulator of FIG. 11 into operation is the transition to high of the output of gate 756. During initialization, both outputs of gates 756 and 766 remain low. When the output of gate 756 goes high, however, this enables switch 750, i.e., enabled AND gates 750a and 750b, thereby enabling the demodulator circuit 701. Similarly, with the output of gate 766 being low, gates 760a and 760b are disabled maintaining the switch 760 disabled and, therefore, the demodulator circuit 703 disabled.

At this point, the demodulator is ready to begin operation with the upper demodulator monitoring a positive-going transition in the FM signal 411. The rising edge on signal line 758, i.e., as presented by the output of gate 756 enters the major delay element 700 and travels through major delay element 700 for a given period of time. Upon exiting the major delay elements 700, the rising edge passes in parallel through the long delay element 702 and short delay element 704 and appears for selection at the switch 750 following corresponding delay intervals. Eventually, the rising edge passes through OR gate 750c thereby presenting a rising edge as the clock 754. This clocks the latch 770 and determines whether the FM signal positive-going transition is before or after this rising edge.

Concurrently with presentation to the latch 770, the rising edge in clock 754 also arrives as an input to the gate 756. This condition causes the output of gate 756 to go low and the output of gate 766 to go high. Accordingly, the RS flip-flop 751 has changed state. The negative transition of gate 756 as presented on signal line 758 enters major delay element 700 and later enters in parallel long and short delay elements 702 and 704 as a negative transition. Because gates 750a and 750b are now disabled, as a result of the signal line 758 being low, the negative-going transition does not enter circuit 701, but rather travels down through the inverters 710 and 712 to circuit 703 and appears as, a positive-going edge. This rising edge then enters gates 760a and 760b of switch 760, then enabled by virtue of the high state on signal line 768. Depending on the state of switch 760, a selected one of the gates 760a and 760b passes this rising edge to OR gate 760c for presentation as a clock 764 to the latch 780. This clocks the latch 780 and indicates, as described herein above, the relative timing of the clock signal rising edge at the latch 780 relative to the negative-going transition in the FM signal 411, which appears inverted as a positive-going transition in signal 411a.

In addition to clocking the latch 780, the rising edge transition presented by clock 764 also applies to the RS flip-flop 751. In particular, the rising edge applies to an input of the gate 766. This causes gate 766 output to go low and thereby causes the output of gate 756 to go high. This returns the circuit to the initial state described above and the circuit continues to iterate between operation of the demodulator circuit 701 and demodulator circuit 703. Thus, a circulating edge travels through the demodulator of FIG. 11 causing alternating enabling and disabling conditions, by way of the RS flip-flop 751, in the switches 750 and 760 of the demodulator circuits 701 and 703, respectively, and generating alternating clocks 754 and 764 which cause latches 770 and 780 to alternately sample FM signal 411 for the positive and negative transitions.

Because the demodulator circuit is self-correcting by negative feedback and will always bring the circulating edge transition within a given proximity of the FM signal 411 transitions, the initialize signal 714 may be removed arbitrarily at any time. However, the circuit may be brought more quickly into demodulation by synchronizing removal of the initialize signal 714 in relation to the FM signal 411 transitions of interest. In other words, remove the initialize signal 714 at a time when the circulating edge transition will occur close to the next FM signal 411 transition of interest. In this manner, the demodulator circuit will more quickly begin providing meaningful output, and therefore more quickly begin presenting information sufficient to derive frequency of the FM signal 411.

It will be appreciated that the present invention is not restricted to the particular embodiments that have been described and illustrated, and that variations may be made therein without departing from the scope of the invention as found in the appended claims and equivalents thereof.

For example, the sigma-delta digital FM demodulator of the present invention bears some similarity to sigma-delta analog-to-digital data convertors. Many enhancements have been developed with respect to such sigma-delta analog to digital convertors, and these enhancements can be applied to the sigma-delta FM digital demodulator of the present invention. Such enhancements include an integrator having more than one pole, i.e., a multi-pole integrator or integrators in combination with band pass filters having poles at non-zero frequencies. Such a multi-pole combination can force quantization noise away from data frequencies and thereby provide enhanced signal processing. After having the benefit of the present disclosure, and familiarity with sigma-delta analog-to-digital convertors, those skilled in the art will appreciate that other enhancements applicable to sigma-delta analog-to-digital convertors may be equally applicable to design modifications of sigma-delta digital FM demodulators in accordance with the present invention.

What is claimed is:

1. A method of digital frequency demodulation comprising the steps:

monitoring selected conditions of an FM signal;

selecting, based on an accumulated error value, one of a plurality of anticipated times between said selected conditions;

detecting a time difference between an actual next selected condition and the selected anticipated time therefor; and incorporating said difference into said accumulated error value.

2. A method according to claim 1 wherein said selected conditions comprise chosen transitions of said FM signal.

3. A method according to claim 2 wherein said chosen transitions comprise adjacent chosen signal transitions.

4. A method according to claim 1 wherein said accumulated error value is maintained in an integrator device.

5. A method according to claim 1 wherein said accumulated error value is maintained as a position of a signal condition within a delay element.

6. A method according to claim 5 wherein said delay element comprises a series of digital gates.

7. A method according to claim 6 wherein said signal condition comprises a signal edge transition.

8. A method according to claim 1 wherein said accumulated error value is maintained as the phase of an oscillator.

9. A method according to claim 1 wherein said step of detecting a time difference comprises the step of determining one of an early arrival or late arrival of one of selected conditions relative to a corresponding anticipated time therefor.

10. A method according to claim 1 wherein said selected conditions comprise adjacent similar transitions in said FM signal.

11. A method according to claim 10 wherein said adjacent similar transitions comprise one of rising edge transitions and falling edge transitions.

12. An FM signal demodulator providing an indication of frequency for an FM signal applied thereto, said demodulator comprising:

a bi-frequency oscillator having a bi-state input, said oscillator providing an output condition at a first frequency for a first state of said bi-state input and a second frequency for a second state of said bi-state input; and a relative timing block receiving an FM signal to be demodulated and receiving said oscillator output, said relative timing block having an output coupled to said oscillator bi-state input and providing said first state of said input when said oscillator output precedes a next chosen signal condition in said FM signal and providing said second state of said input when said oscillator output follows a next chosen signal condition.

* * * * *